(12) United States Patent
Kim et al.

(10) Patent No.: US 11,612,087 B2
(45) Date of Patent: Mar. 21, 2023

(54) CONNECTION STRUCTURE FOR RADIO FREQUENCY COMPONENTS AND ELECTRONIC DEVICE INCLUDING SAME

(71) Applicant: Samsung Electronics Co., Ltd., Suwon-si (KR)

(72) Inventors: Dongjoo Kim, Suwon-si (KR); Bonmin Koo, Suwon-si (KR); Jonghwa Kim, Suwon-si (KR); Seunghwan Yoon, Suwon-si (KR); Youngju Lee, Suwon-si (KR); Jongwook Zeong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/929,394

(22) Filed: Apr. 30, 2020

(65) Prior Publication Data

US 2020/0352060 A1    Nov. 5, 2020

(30) Foreign Application Priority Data

May 3, 2019    (KR) .................... 10-2019-0052562

(51) Int. Cl.
*H05K 9/00*    (2006.01)
(52) U.S. Cl.
CPC ......... *H05K 9/0032* (2013.01); *H05K 9/0026* (2013.01); *H05K 9/0039* (2013.01); *H05K 2201/10371* (2013.01)
(58) Field of Classification Search
CPC .. H05K 9/0032; H05K 9/0024; H05K 9/0026; H05K 9/0039; H05K 2201/10371
See application file for complete search history.

(56) References Cited

U.S. PATENT DOCUMENTS 6,417,747 B1 * 7/2002 Dearden ................ H01L 23/66
                                                    333/247
6,459,890 B1 * 10/2002 Kim ....................... H04B 1/385
                                                    368/204

(Continued)

FOREIGN PATENT DOCUMENTS

KR    10-201500062026 A    6/2015
KR    10-2018-0055772 A    5/2018

(Continued)

OTHER PUBLICATIONS

European Search Report dated Sep. 21, 2020 in connection with European Application No. 20172085.1, 7 pages.

(Continued)

*Primary Examiner* — Rockshana D Chowdhury
*Assistant Examiner* — Douglas R Burtner

(57) ABSTRACT

The present disclosure relates to a pre-5$^{th}$-Generation (5G) or 5G communication system to be provided for supporting higher data rates Beyond 4$^{th}$-Generation (4G) communication system such as Long Term Evolution (LTE). The present disclosure relates to connection structure for radio frequency components and electronic device including same According to various embodiments, a connection assembly for radio frequency (RF) components may include: a first RF component including an opening section and a protrusion formed in the opening section; an elastic structure; a printed circuit board (PCB); and a second RF component connected to the PCB. The elastic structure may be disposed on a first surface of the PCB, a first surface of the first RF component including the opening section may be coupled to the first surface of the PCB, and the protrusion of the first RF component may come in contact with the elastic structure, thereby forming an electrical connection between the first RF component.

7 Claims, 15 Drawing Sheets

(56) References Cited

U.S. PATENT DOCUMENTS

| | | | |
|---|---|---|---|
| 7,288,727 B1* | 10/2007 | Garcia | H05K 9/0032 |
| | | | 174/369 |
| 8,647,128 B2 | 2/2014 | Sykes et al. | |
| 10,320,132 B2* | 6/2019 | Zeng | H01R 13/621 |
| 10,595,451 B1* | 3/2020 | Wang | H05K 1/0216 |
| 10,957,961 B2* | 3/2021 | Kim | H01P 1/2088 |
| 11,031,717 B2* | 6/2021 | Cho | H01R 12/718 |
| 11,088,731 B2* | 8/2021 | Kim | H01Q 1/246 |
| 11,482,803 B2* | 10/2022 | Park | H01P 1/045 |
| 2004/0266384 A1 | 12/2004 | Davis | |
| 2010/0248655 A1* | 9/2010 | Yahagi | H01Q 1/243 |
| | | | 455/90.3 |
| 2014/0177181 A1* | 6/2014 | Malek | H05K 3/30 |
| | | | 361/749 |
| 2015/0288113 A1* | 10/2015 | Seo | H01R 13/703 |
| | | | 439/78 |
| 2017/0027058 A1* | 1/2017 | Perkins | H01L 23/60 |
| 2017/0358847 A1 | 12/2017 | Cho et al. | |
| 2019/0268046 A1* | 8/2019 | Kim | H01Q 21/28 |
| 2019/0348734 A1* | 11/2019 | Kim | H01Q 1/241 |
| 2021/0098849 A1* | 4/2021 | Park | H01P 1/045 |
| 2021/0098850 A1* | 4/2021 | Park | H01P 7/065 |
| 2021/0098851 A1* | 4/2021 | Park | H01R 13/2421 |
| 2021/0098852 A1* | 4/2021 | Park | H01P 5/085 |
| 2021/0098912 A1* | 4/2021 | Park | H01P 7/06 |
| 2021/0234245 A1* | 7/2021 | Kim | H01P 1/207 |

FOREIGN PATENT DOCUMENTS

| | | |
|---|---|---|
| KR | 10-201800089265 A | 8/2018 |
| KR | 10-2019-0041979 A | 4/2019 |
| WO | 2018093176 A2 | 5/2018 |

OTHER PUBLICATIONS

European Patent Office, "Communication pursuant to Article 94(3) EPC" dated Nov. 24, 2021, in connection with European Patent Application No. 20172085.1, 6 pages.

* cited by examiner

CONNECTION STRUCTURE FOR RADIO FREQUENCY COMPONENTS AND ELECTRONIC DEVICE INCLUDING SAME

CROSS-REFERENCE TO RELATED APPLICATION

This application is based on and claims priority under 35 U.S.C. 119 to Korean Patent Application No. 10-2019-0052562, filed on May 3, 2019, in the Korean Intellectual Property Office, the disclosure of which is herein incorporated by reference in its entirety.

BACKGROUND

1. Field

Various embodiments described below relate to a connection structure for radio frequency (RF) components and an electronic device including the same.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'.

The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

In order to improve communication performance, products equipped with multiple antennas are being developed and it is expected that equipment having more antennas will be gradually employed using massive MIMO technology. An increase in the number of antenna elements in a communication device inevitably causes an increase in the number of RF components (e.g. a transceiver, a filter, a power amplifier, etc.).

The above information is presented as background information only to assist with an understanding of the disclosure. No determination has been made, and no assertion is made, as to whether any of the above might be applicable as prior art with regard to the disclosure.

SUMMARY

On the basis of the above description, an aspect of the disclosure is to provide a connection structure for radio frequency (RF) components in a wireless communication system and an electronic device including the same.

Another aspect of the disclosure is to provide a structure for an electrical connection between an RF component and a printed circuit board (PCB) and an electronic device including the same.

Another aspect of the disclosure is to provide a structure for an electrical connection between a surface structure and an elastic structure and an electronic device including the same.

Another aspect of the disclosure is to provide a connection structure between RF components for providing a wide allowable processing/assembling tolerance and an electronic device including the same.

According to various embodiments, a connection assembly for radio frequency (RF) components may include: a first RF component including an opening section and a protrusion formed in the opening section; an elastic structure; a printed circuit board (PCB); and a second RF component connected to the PCB, wherein the elastic structure may be disposed on a first surface of the PCB, a first surface of the first RF component including the opening section may be coupled to the first surface of the PCB, and the protrusion of the first RF component may come in contact with the elastic structure, thereby forming an electrical connection between the first RF component and the second RF component.

According to various embodiments, an electronic device in a wireless communication system may include: a first PCB including multiple antenna elements; multiple filters; a second PCB including multiple RF components; and at least one processor, wherein each of the multiple filters may include a first RF input/output part for connecting the filter to an elastic structure of the first PCB, the first RF input/output part may include a first guide part and a first protrusion, the first guide part may include a first fastening surface connected to the first PCB and a first opening section connected to the first protrusion, and the first protrusion may be disposed in the first opening section so as to come in contact with the elastic structure of the first PCB.

A device and a method according to according to various embodiments can use a connection structure between RF components to provide a wide processing/assembling tolerance while ensuring connection performance.

Effects obtainable from the disclosure may not be limited to the above mentioned effects, and other effects which are not mentioned may be clearly understood, through the following descriptions, by those skilled in the art to which the disclosure pertains.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
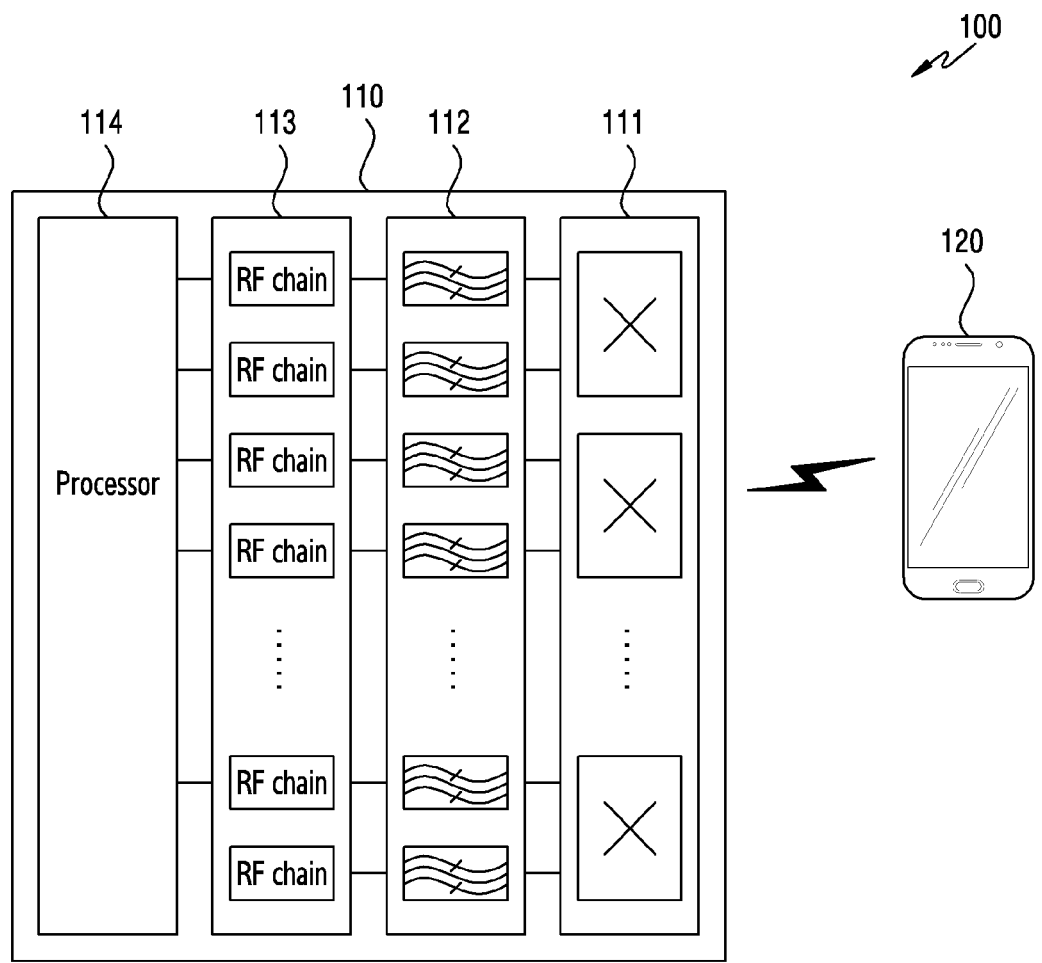
FIG. 1 illustrates an example of an electronic device according to various embodiments.

FIGS. 1 through 9B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

The terms used in the disclosure are only used to describe specific embodiments, and are not intended to limit the disclosure. A singular expression may include a plural expression unless they are definitely different in a context. Unless defined otherwise, all terms used herein, including technical and scientific terms, have the same meaning as those commonly understood by a person skilled in the art to which the disclosure pertains. Such terms as those defined in a generally used dictionary may be interpreted to have the meanings equal to the contextual meanings in the relevant field of art, and are not to be interpreted to have ideal or excessively formal meanings unless clearly defined in the disclosure. In some cases, even the term defined in the disclosure should not be interpreted to exclude embodiments of the disclosure.

Hereinafter, various embodiments of the disclosure will be described based on an approach of hardware. However, various embodiments of the disclosure include a technology that uses both hardware and software, and thus the various embodiments of the disclosure may not exclude the perspective of software.

Hereinafter, the disclosure relates to a connection structure between RF components for a wireless communication system and an electronic device including the same. Specifically, the disclosure describes a technology for forming an efficient connection in performance/space/cost aspects through a connection structure between an elastic structure and an RF component including a contact part. A tolerance described in the disclosure refers to an allowable limit of a standard range. The standard range may be determined according to an allowable range determined based on a nominal size, i.e., a tolerance. An accumulated tolerance or tolerance accumulation refers to an allowable limit of an assembly according to accumulation of an allowable limit of a single component when multiple components are assembled. A processing tolerance may refer to a tolerance determined according to component processing.

As used in the description below, the terms indicating components of an electronic device (e.g. "filter", "amplifier", "printed circuit board (PCB)", "flexible PCB (FPCB)", "antenna element", "compensation circuit", "processor", "chip", "element", and "device"), the terms indicating the shape of a component (e.g. "structure", "opening section", "connection part", "contact part", "guide part", "protrusion", "stator", and "elastic body"), the terms indicating a connection part between structures (e.g. "connection part", "contact part", "contact element", "contact structure", "contact terminal", "connection element", "boss", "conductive member", and "assembly"), the terms indicating a circuit (e.g. "printed circuit board (PCB)", "flexible PCB (FPCB)", "signal line", "data line", "RF signal line", "antenna cable", "RF path", "RF module", "RF circuit", "RFA", and "RFB"), etc. are provided as examples for the convenience of description. Therefore, the disclosure is not limited to the terms used below, and other terms having the same technical meaning may be used. Further, the terms "unit", "device", "member", "body", etc. used hereinafter may indicate at least one shape structure or may indicate a unit for processing a function.

FIG. 1 illustrates an example of an electronic device according to various embodiments. In a wireless communication environment 100 in FIG. 1, a base station 110 and a terminal 120 are provided as some of nodes, each of which uses a wireless channel.

The base station 110 is a network infrastructure for providing the terminal 120 with radio access. The base station 110 has coverage defined as a predetermined geographical region on the basis of a distance to which a signal can be transmitted. The base station 110 may be called not only base station but also "access point (AP)", "eNodeB (eNB)", "5th generation node (5G node)", "5G NodeB (NB)", "wireless point", "transmission/reception point (TRP)", "access unit", "distributed unit (DU)", "radio unit (RU)", "remote radio head (RRH)", or other terms having a technical meaning identical thereto. The base station 110 may transmit a downlink signal or may receive an uplink signal.

The terminal 120 is a device used by a user and performs communication with the base station 110 via a wireless channel. In some cases, the terminal 120 may be operated without the involvement of the user. That is, the terminal 120 is a device for performing machine type communication (MTC), and may not be carried by the user. The terminal 120 may be called not only "terminal" but also "user equipment (UE)", "mobile station", "subscriber station", "customer premises equipment (CPE)", "remote terminal", "wireless terminal", "electronic device", "vehicle terminal", "user device", or other terms having a technical meaning identical thereto.

In order to improve communication performance, the number of antennas (or antenna elements) of equipment for performing wireless communication increases. Further, the number of RF components for processing a RF signal transmitted or received through an antenna element increases. Thus, configuring communication equipment is necessarily required to have a spatial gain and a cost efficiency while meeting communication performance. Hereinafter, in FIG. 1, in order to describe a connection structure and an electronic device including the same according to the disclosure, RF components of the base station 110 in FIG. 1 are used as examples. However, various embodiments are not limited thereto. Needless to say, the connection structure and the electronic device including the same according to the disclosure may be applied to the terminal 120 in FIG. 1, wireless equipment (e.g. TRP) connected to a base station, or other equipment requiring a stable connection structure for communication components for processing a signal.

FIG. 1 illustrates an exemplary functional configuration of the base station 110. The base station 110 may include an antenna unit 111, a filter unit 112, a radio frequency (RF) processing unit 113, and a controller 114.

The antenna unit 111 may include multiple antennas. Each of the antennas performs a function of transmitting and receiving a signal via a wireless channel. Each antenna may include a conductor formed on a substrate (e.g. a PCB) or a radiator formed as a conductive pattern. Each antenna may radiate an up-converted signal on a wireless channel or may obtain a signal radiated by another device. Each antenna may be called an antenna element or an antenna device. In some embodiments, the antenna unit 111 may include an antenna array in which multiple antenna elements are arrayed. The antenna unit 111 may be electrically connected to the filter unit 112 via RF signal lines. The antenna unit 111 may be mounted on a PCB including multiple antenna elements. The PCB may include multiple RF signal lines, each of which connects an antenna element to a filter of the filter unit 112. The RF signal lines may be called a feeding network. The antenna unit 111 may provide a received signal to the filter unit 112 or may radiate, to the air, a signal provided from the filter unit 112.

The filter unit 112 may perform filtering in order to transmit a signal of a desired frequency. The filter unit 112 may form resonance to perform a function for selectively identify a frequency. In some embodiments, the filter unit 112 may form resonance through a cavity structurally including a dielectric material. Further, in some embodiments, the filter unit 112 may form resonance through elements configured to form inductance or capacitance. The filter unit 112 may include at least one among a band-pass filter, a low-pass filter, a high-pass filter, or a band-reject filter. That is, the filter unit 112 may include RF circuits for obtaining a signal in a frequency band for transmission or in a frequency band for reception. The filter unit 112 according to various embodiments may electrically connect the antenna unit 111 to the RF processing unit 113.

The RF processing unit 113 may include multiple RF paths. Each of the RF paths may be a unit of a path through which a signal received via an antenna or a signal radiated via the antenna passes. At least one RF path may be called an RF chain. An RF chain may include multiple RF elements. The RF elements may include an amplifier, a mixer, an oscillator, a digital-to-analog converter (DAC), an analog-to-digital converter (ADC), etc. For example, the RF processing unit 113 may include an up-converter for up-converting a digital transmission signal of a base band into a transmission frequency and a DAC for converting the up-converted digital transmission signal into an analog RF transmission signal. The up-converter and the DAC form a part of a transmission path. The transmission path may further include a power amplifier (PA) or a coupler (or combiner). Further, for example, the RF processing unit 113 may include an ADC for converting an analog RF reception signal into a digital reception signal and a down-converter for converting a digital reception signal into a digital reception signal of a base band. The ADC and the down-converter form a part of a reception path. The reception path may further include a low-noise amplifier (LNA) or a coupler (or a divider). RF components of the RF processing unit may be implemented on a PCB. The base station 110 may include a structure in which the antenna unit 111, the filter unit 112, and the RF processing unit 113 are stacked in order of the antenna unit 111-the filter unit 112-the RF processing unit 113. The antennas and the RF components of the RF processing unit may be implemented on PCBs, and filters may be repeatedly fastened between the PCBs to form multiple layers.

The controller 114 may control overall operation of the base station 110. The controller 114 may include various modules for performing communication. The controller 114 may include at least one processor. The controller 114 may include modules for digital signal processing. For example, at the time of data transmission, the controller 114 may generate duplicate symbols by encoding and modulating a bit stream to be transmitted. Further, at the time of data reception, the controller 114 reconstructs a received bit stream by decoding and demodulating a base band signal. The controller 114 may perform protocol stack functions required by a communication standard.

With a remarkably increased data transmission capacity and use of a high-frequency band, a structure having multiple dense antenna elements may be used for wireless communication. With the increased number of antennas, complexity of RF components for processing an RF signal increases. Due to lease costs or spatial limits of an installation place, it may be required to make small, light, and inexpensive RF components (e.g. an antenna element, a filter, a power amplifier, and a transceiver). In addition, as communication equipment is implemented in a form in which multiple RF components are assembled, a tolerance occurring whenever the RF components are assembled may increase and thus may degrade performance of the communication equipment. Further, even when the same function is performed, a cost for satisfying communication performance, required due to a structural difference or an electrical characteristic difference, may act as an overhead.

For example, communication equipment may include multiple filters (e.g. a filter providing N ports (which may be called "N-Port 1-body filter")). The RF components may be implemented in a form in which the same are integrated on a PCB. Each filter may be electrically connected to the PCB including the RF components. For harmonization with spatial limits, cost limits due to mass production, and tolerance accumulation, a connection structure between multiple filters and multiple RF components becomes a very important factor for the electrical/mechanical/price competitiveness of a product.

A blind mating connector may be used for a wide allowable tolerance at the time of assembling each filter and an RF component. However, the blind mating connector may have a limit in reducing the height of a filter due to the size of the blind mating connector, and may be ineffective in terms of a price. Further, a structure for connecting a filter to a PCB in a pin-socket form may be used in view of the size of a filter and a cost. However, the structure has a rather limited assembling tolerance and thus may not be suitable for communication equipment in which multiple RF components are fastened. For the wide allowable assembling tolerance, a method for forming an electrical connection through the fastening structure of a pin structure including an elastic spring and an insulation bush may be used as a method in which a PCB and a filter are in direct contact with each other. However, for the reliability of the connection, precise management for the pin structure and a ground may be required.

There has been a need for an economically/structurally/electrically efficient connection structure which is more suitable for mass production than the above-described connection methods and secures a wider margin for a position so as to maximize a processing tolerance in addition to an assembling tolerance. Therefore, various embodiments provide a connection structure for minimizing a tolerance, a process variation between components, a processing variation, which may be generated by fastening and assembling multiple RF components, and stably securing an electrical connection of RF components.

Hereinafter, the disclosure describes, as an example, a connection structure between a PCB including an RF component (e.g. the antenna unit 111 in FIG. 1) and a PCB including a filter (e.g. the filter unit 112 in FIG. 1. However, various embodiments are not limited thereto. In order to minimize an accumulated tolerance, a processing error, etc. due to coupling between multiple components, various embodiments may also be applied to a connection structure between other RF components. For example, the connection structure of the disclosure may be applied to a connection between a PCB including an RF component (e.g. the antenna unit 111 in FIG. 1) and a PCB including a filter (e.g. the filter unit 112 in FIG. 1, a connection between a filter and a calibration network circuit, a connection between an amplifier and a filter, or a connection between an amplifier and a phase shifter.

Figure 2A:
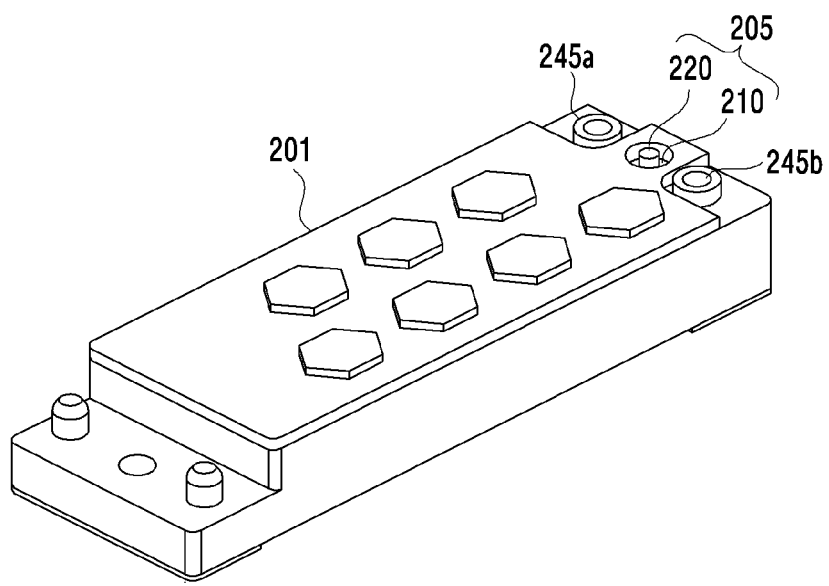
FIG. 2A illustrates an example of a filter according to various embodiments.

FIG. 2A illustrates an example of a filter according to various embodiments. A cavity filter is provided as an example of the filter.

Referring to FIG. 2A, a filter 201 may include an input/output port 205. The input/output port may be disposed on one surface of the filter. In accordance with one embodiment, an additional input/output port may be further included on a symmetrical surface. Further, in accordance with one embodiment, the filter may include N (N is an integer equal to or greater than 3) input/output ports. The input/output port 205 may be a signal line for providing an electrical input or output of an RF signal.

The input/output port 205 may include a guide part 210 and a protrusion 220 for an electrical connection between PCBs. The protrusion 220 can be referred to as not only the protrusion but also the protrusion unit or the protruding portion. The upper surface of the filter 201 may include multiple fastening grooves 245a and 245b so as to be fastened to a PCB including an antenna. The filter 201 according to various embodiments may be coupled to the same type of filters. A structure in which multiple filters are coupled may be called a filter assembly. The filter assembly may form a stack structure together with a PCB. When the filter assembly includes more filters and each filter is coupled to the PCB, the tolerance accumulation amount may increase. In order to reduce an effect due to the tolerance accumulation amount, various embodiments propose a connection structure having a wide allowable tolerance.

The guide part 210 according to various embodiments may be an opening section obtained by forming a groove on one surface of the filter 201. The protrusion 220 according to various embodiments may be disposed in a protruding form in the opening section. The guide part 210 may be a structure for guiding the arrangement between the protrusion 220 and an elastic structure coming in physical contact with the protrusion 220. The protrusion 220 and the elastic structure attached to a PCB come in contact with each other and may be flexibly arranged within an allowable range. The protrusion 220 may include a contact surface in order to come in contact with the elastic structure. A surface-shaped structure may come in contact with the elastic structure so that an electrical connection is formed therebetween. The guide part 210 may include an opening section which surrounds the protrusion 220 and the surface of the filter 201 coupled to a PCB.

FIG. 2A illustrates that the guide part 210 and the protrusion 220 are arranged on one surface (e.g. the top surface) of the filter 201, but various embodiments are not limited thereto. The guide part 210 and the protrusion 220, which are connection structures in the filter 201, are variously positioned. In some embodiments, unlike FIG. 2A, the guide part 210 and the protrusion 220, which are connection structures, may be arranged on the bottom surface of the filter 201. Further, in some embodiments, the guide part 210 and protrusion 220 may be arranged on both ends of the filter 201 in the same direction or in opposite directions, respectively.

Figure 2B:
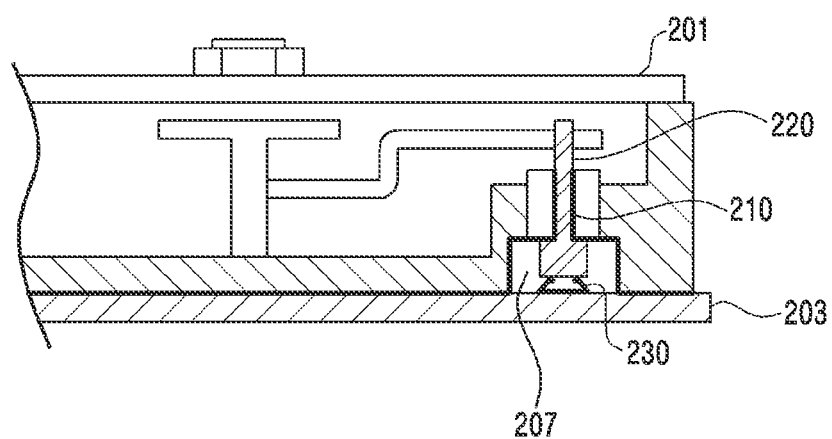
FIG. 2B illustrates an example of a cross-section of a connection structure between a radio frequency (RF) component and an elastic structure according to various embodiments.

FIG. 2B illustrates an example of a cross-section of a connection structure between a radio frequency (RF) component and an elastic structure according to various embodiments. The filter 201 in FIG. 2A is provided as an example of the RF component.

Referring to FIG. 2B, the filter 201 may include the guide part 210. As described in FIG. 2A, the guide part 210 may include an opening section formed on one surface (in the x-axis direction) of the filter 201 and having an open predetermined portion. The guide part 210 may be a structure for guiding a flexible arrangement between the filter 201 and a PCB 203. The filter 201 and the PCB 203 may have a flexible arrangement in a space (hereinafter, a guide region 207) formed by the opening section of the guide part 210. A predetermined range may refer to an allowable range of an assembling tolerance or processing error. For example, the opening section of the guide part 210 may provide an allowable tolerance according to a leftward/rightward movement (a movement in the x-axis direction) between filter 201 and the PCB 203. Further, the opening section of the guide part 210 may provide an allowable tolerance according to an upward/downward movement (a movement in the y-axis direction) made in the opening section depending on the degree of elasticity of an elastic structure 230 described below.

One surface of the guide part 210 including a groove may come in contact with one surface of the PCB 203. The guide part 210 provides an allowable range of a physical contact structure between the filter 201 and the elastic structure 230 attached to the PCB 203, and may be fastened to the PCB 203 by forming a symmetrical surface. In one example, the guide part 210 of the filter 201 may be mechanically connected to the PCB 203 through a fastening groove (e.g. the fastening grooves 245a and 245b in FIG. 2A).

The protrusion 220 may be positioned in as space of the opening section of the guide part 210, i.e. in a guide region 209. The protrusion 220 has a cylindrical shape protruding in a specific direction (e.g. the (−) y-axis direction) within the guide region 209. At least one surface of the protrusion 220 may come in contact with the elastic structure 230.

The protrusion 220 may include a conductive member. The protrusion 220 may include a conductive member for transmitting an RF signal. The protrusion 220 may come in physical contact with the elastic structure 230 attached to the PCB 203. A surface (hereinafter, a contact surface) of the protrusion 220 may be electrically connected to the elastic structure 230 by coming in direct contact with the elastic structure 230. At least one contact surface of the protrusion 220 may form an electrical connection to the elastic structure 230 by forming a contact with the elastic structure 230. Since the formation of a contact for an electrical connection is required, the shape of the protrusion 220 according to various embodiments may be related to the shape of the elastic structure 230. For example, the contact surface of the protrusion 220 may be related to the shape of a contact part of the elastic structure 230. In one example, the protrusion 220 may be a cylinder. In one example, the protrusion 220 may be a square pillar. Further, in one example, the protrusion 220 may have a conical shape. In one example, the protrusion 220 may be a sphere. In one example, the protrusion 220 may have a shape in which the contact surface thereof is concave or convex. Further, for example, the protruding height of the protrusion 220 may be related to the size of the elastic structure 230.

The elastic structure 230 may be attached to the surface of the PCB 203. The elastic structure 230 may be attached to the PCB 203 in such a manner that an electrical connection is formed therebetween. For example, the elastic structure 230 may be attached to the PCB 203 through a conductive tape. Further, for example, the elastic structure 230 may be soldered and attached to the PCB 203. The elastic structure 230 may include a conductive member for an electrical connection. The elastic structure 230 may be attached to the PCB 203 to form an electrical connection to the PCB 203. Further, the elastic structure 230 may form an electrical connection between the filter 201 and the PCB 203.

The elastic structure 230 may come in contact with the protrusion 220 while being attached to the surface of the PCB 203. The elastic structure 230 may form an electrical connection between the filter 201 and the PCB 203 by coming in contact with the protrusion 220. Through an electrical connection to the protrusion 220, the elastic structure 230 may provide the PCB 203 with a signal transmitted from the filter 201, or may transmit, to the filter 201, a signal transmitted from the PCB 203.

The elastic structure 230 may include an elastic member. The elastic member may have an elastic force for providing a stable electrical connection without being affected by the height difference between one surface of the guide part 210 of the filter 201 and the contact surface of the protrusion 220. For example, when the height ((+) y-axis direction) difference between one surface of the guide part 210 and one surface of the protrusion 220 is h1, the elastic structure 230 may have a height corresponding to h2 (=≥h1) equal to or greater than h1. Since pressure corresponding to the height difference (h2−h1) is applied, the elastic structure 230 may include an elastic member capable of receiving the pressure. That is, the elastic structure 230 may have a contractible shape so as to receive pressure applied by the protrusion 220. Further, the elastic structure 230 may include a conductive member having an elastic force for maintaining a stable electrical connection even while being contracted.

A cross-section of a connection structure between the protrusion 220 and the elastic structure 230 has been described with reference to FIG. 2B. Hereinafter, an example of the connection structure between the protrusion 220 and the elastic structure 230 will be described with reference to the perspective view of FIG. 3.

Figure 3:
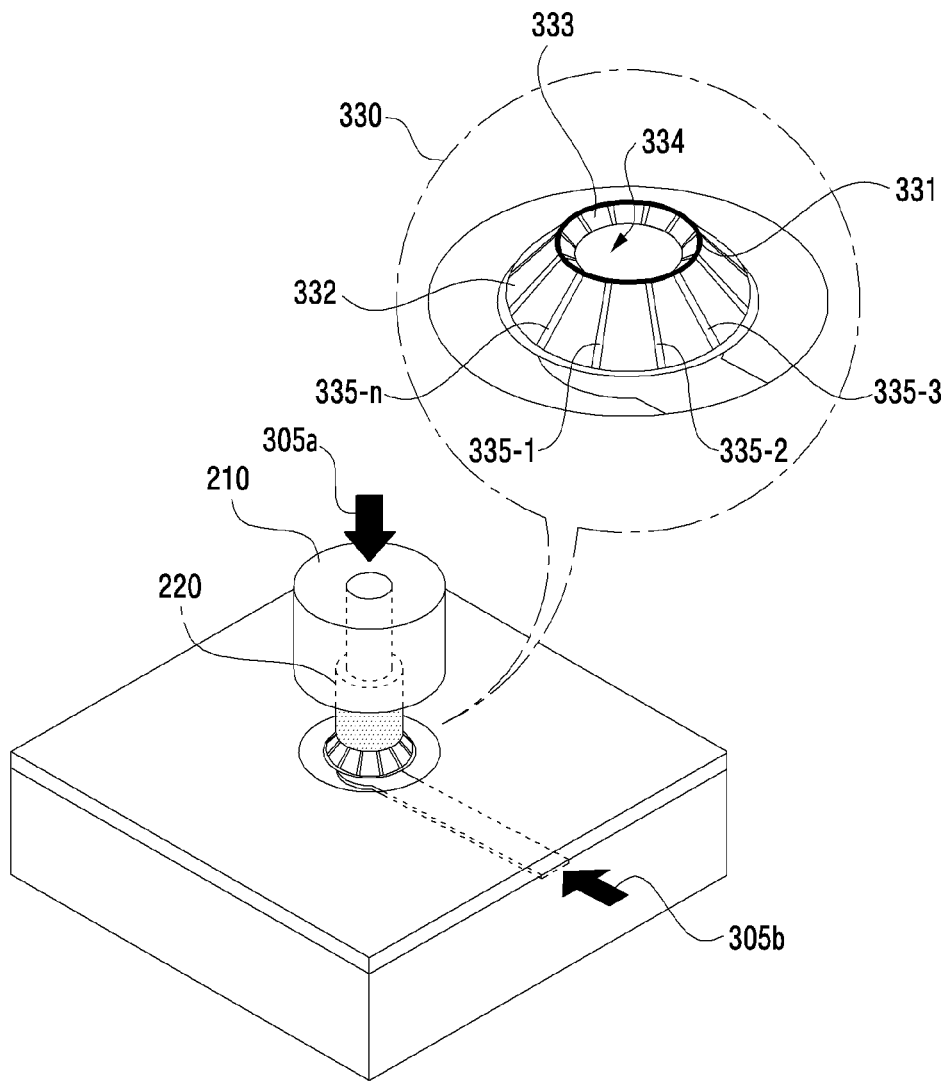
FIG. 3 illustrates an example of a connection structure between an RF component and an elastic structure according to various embodiments.

FIG. 3 illustrates an example of a connection structure between an RF component and an elastic structure according to various embodiments. The filter 201 in FIG. 2B is provided as an example of the RF component. The elastic structure 230 in FIG. 2B is provided as an example of the elastic structure.

Referring to FIG. 3, the filter 201 and the PCB 203 may be assembled and fastened. The filter 201 and the PCB 203 may be assembled by bringing the protrusion 220 of the filter 201 into physical contact with the elastic structure 230 of the PCB 203. In the disclosure, structures in which the protrusion of the filter 201 and the elastic structure 230 of the PCB 203 come in contact with each other so as to form a connection therebetween may be called a connection assembly.

A contact structure of a connection assembly according to various embodiments may have an allowance. For example, each component has a predetermined range of tolerance in the manufacturing process, and thus the tolerance may be accumulated in the assembling process. Further, due to a movement of communication equipment, external pressure, etc., the relative positions of the protrusion 220 and the elastic structure 230 may be changed. Further, for example, the real size of each component may be changed by abrasion of the component over time, a change due to temperature, etc., and thus this may change the position of each of the protrusion 220 and the elastic structure 230. The position change changes the fastening strength of a contact structure between the protrusion 220 and the elastic structure 230, and thus a connection structure having more allowances may be required.

The guide part 210 may fix the protrusion 220, and may guide a flexible arrangement region which the elastic structure 230 can have within a predetermined range at the time of coming in contact with the protrusion 220. Meanwhile, FIG. 3 illustrates that a cylindrical guide region is provided, but, needless to say, a guide region having other shapes may be formed. The guide part 210 may be physically fastened to the protrusion 220 and may provide a region in which the protrusion 220 comes in stable contact with the elastic structure 230.

The protrusion 220 may have a cylindrical shape having a volume in a direction perpendicular to one surface of the PCB 203 (e.g. in the z-axis direction). The cylindrical shape may include a side surface surrounding the z-axis and a contact surface forming the bottom surface in a direction in which the cylindrical shape is seen along the (+) z-axis from under the x-y plane. The protrusion 220 in FIG. 3 is illustrated in a cylinder shape, but may be formed to have other shapes. That is, the cylindrical shape illustrated in FIG. 3 is an example. Thus, when the protrusion 220 is a structure positioned in an opening section of the guide part 210 and having a protruding shape, the protrusion 220 may be connected to an elastic structure according to various embodiments. The protrusion 220 is a structure including a conductive surface, and may come in contact with the elastic structure 230 at the conductive surface thereof so as to form an electrical connection to the PCB 203. The conductive surface of the protrusion 220 may form at least one contact with the elastic structure 230 so that signal lines can be connected to RF components (e.g. an antenna element) in the PCB.

The elastic structure 230 may be attached to one surface (e.g. the top surface parallel to the x-y plane) of the PCB 203. The elastic structure 230 may be attached so as to be electrically connected to RF components installed in the PCB 203 through feeder lines. For example, the elastic structure 230 may be soldered to the PCB 203 so as to connected to the feeder lines. Further, for example, the elastic structure 230 may be connected to the PCB 203 through a conductive tape or a conductive film. Further, for example, the elastic structure 230 may also be attached to a conductive member connected to the PCB 203, thereby maintaining an electrical connection. The filter 201 may be electrically connected to the PCB 203 in order of the protrusion 220-the elastic structure 230-the PCB 203. That is, a path for transmitting an RF signal may be formed between the filter 201 and the PCB 203. The filter 201 may include an RF input/output (I/O) port 305a. Further, the PCB 203 may include an RF input/output port 305b corresponding to the RF input/output port 305a.

The elastic structure 230 may include: an outer surface forming the exterior of the elastic structure 230; a bottom surface; and a contact part for forming at least one contact with the protrusion 220. The contact part may be formed in a ring shape. Further, the elastic structure 230 may include an additional inner surface formed in a ring-shaped inner region of the elastic structure 230. For example, referring to an enlarged view 330 of the elastic structure 230, the elastic structure 230 may include: a contact part 331 for forming a contact with the protrusion 220; an inner surface 333 formed inside the contact part 331; and an outer surface 332 formed outside the contact part 331. In accordance with one embodiment, the elastic structure 230 may not include the inner surface 333.

The contact part 331 may include at least one contact physically coming in contact with the contact surface of the protrusion 220. Through the contact, RF signals may be transmitted to the filter 201 or RF signals passed through the filter may be transmitted to the PCB 203. That is, the formed contact may function as an input/output port for RF signals.

The elastic structure 230 may have a structure bendable by pressure. The structure having a bendable shape may be called a finger structure. Pressure may be applied to the elastic structure 230 in the (−) z-axis direction in order to supplement the difference between: a height difference between the contact surface of the protrusion 220 and a surface (e.g. the x-y plane) to which the filter 201 and the PCB 203 are attached; and the height of the elastic structure 230. The elastic structure 230 may have a shape changeable by pressure. The spatial position or the shape of the inner surface 333 and the outer surface 332 may be changed according to pressure applied to the elastic structure 230. For example, the inner surface 333 and the outer surface 332 may be formed to widen more parallel to the contact surface when vertical pressure is applied to the elastic structure 230. The elastic structure 230 may have a sufficient spatial margin 334 so that performance degradation may not be caused by contact between at least a part of the inner surface 333 and at least another part of the inner surface 333.

In some embodiments, the elastic structure 230 may further include wrinkle parts 335-1, 335-2, 335-3, . . . , and 335-n in order to reduce the influence of pressure applied thereto. The wrinkle parts may minimize a phenomenon in which the inner surface 333 or the outer surface 332 of the elastic structure 230 is partially distorted due to the gap between the guide part 210 and the protrusion 220 or a change in applied pressure. The protrusion 220 may come in contact with the elastic structure 230 in relatively various positions on a guide region of the guide part 210. The elastic structure 230 may receive pressure applied by the protrusion 220 and relatively minimize a shape change due to a pressure direction change made within an assembling tolerance or a processing tolerance, thereby providing a stable electrical connection.

In accordance with various embodiments, the protrusion 220 may further include a ground part therein in order to secure a ground at the same time as input/output of RF signals. The ground part may be provided as a ground path while being connected to the PCB 203 through the inner region of the elastic structure 230. Further, in some embodiments, a support member for further strengthening the elastic force of the elastic structure 230 may be further included. Further, in accordance with one embodiment, a conductive member for supplementing electrical connection performance of the elastic structure 230 may be additionally included.

Figure 4A:
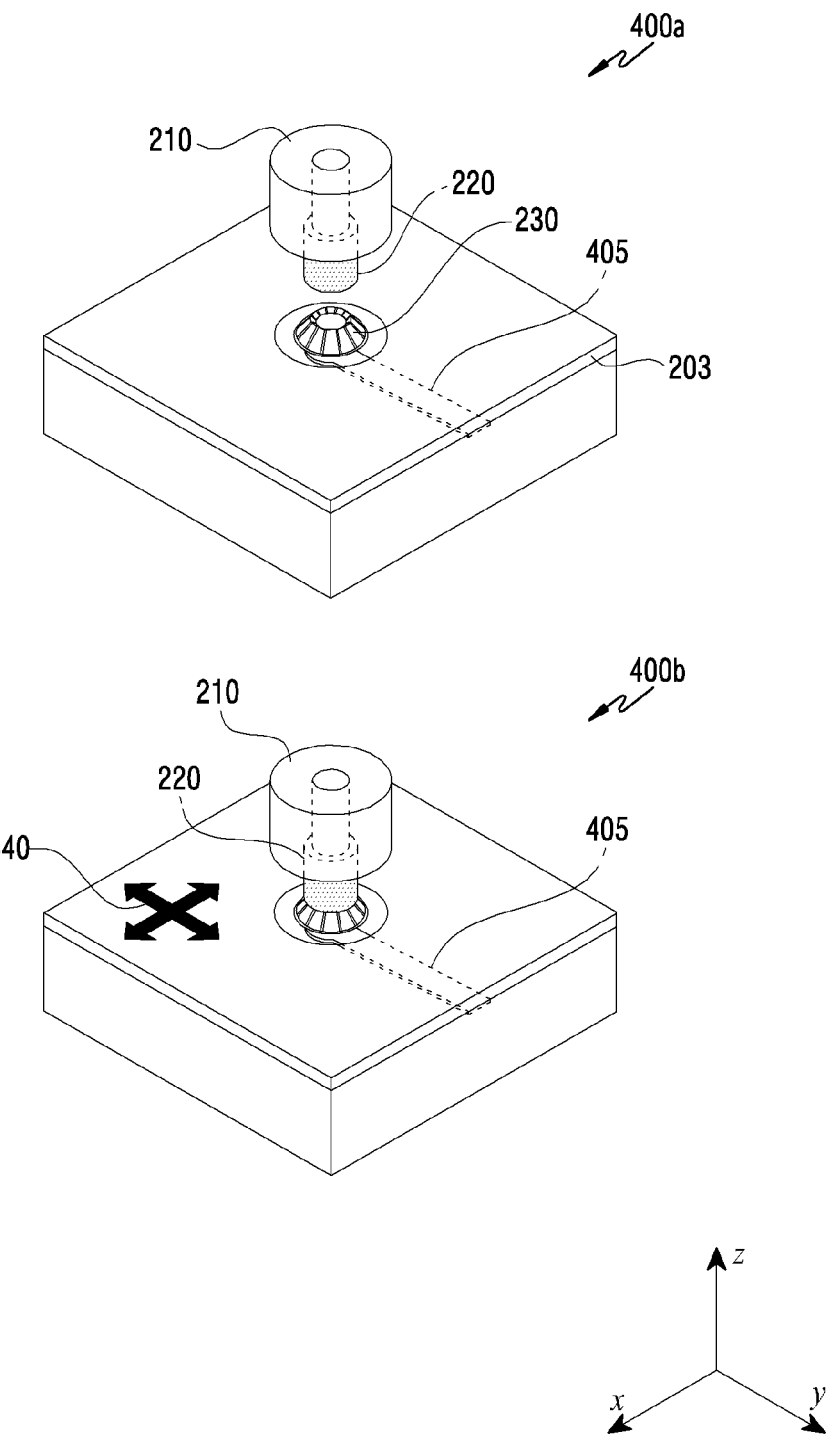
FIG. 4A illustrates an example of the arrangement of a connection structure according to various embodiments.

FIG. 4A illustrates an example of the arrangement of a connection structure according to various embodiments. The connection structure refers to a contact structure of an RF component and an elastic structure. The filter 201 in FIG. 2B is provided as an example of the RF component. The elastic structure 230 in FIG. 2B is provided as an example of the elastic structure.

Referring to FIG. 4A, a first perspective view 400a shows an example of a connection structure before contact between the protrusion 220 and the elastic structure 230. The guide part 210 may fix the protrusion 220 to the filter 201. When the filter 201 is moved in the (−) z-axis direction in order to be fastened to the PCB 203, the protrusion 220 may also be moved in the (−) z-axis direction. When the protrusion 220 is moved in the (−) z-axis direction, the protrusion 220 may come in physical contact with the elastic structure 230. The elastic structure 230 may be connected to an antenna or RF components via a feeder line 405 of the PCB 203.

A second perspective view 400b shows an example of a connection structure after contact between the protrusion 220 and the elastic structure 230. The protrusion 220 has been in physical contact with the elastic structure 230 by the movement of the protrusion 220 in the (−) z-axis direction. Since both the protrusion 220 and the elastic structure 230 are conductive members and can transmit electrical signals, an electrical connection between the filter 201 and the PCB 203 may be maintained.

According to various embodiments, an arrangement form in which the protrusion 220 comes in contact with the elastic structure 230 may be flexibly changed within a predetermined range (440). That is, at the time of assembling the protrusion 220 and the elastic structure 230, a connection structure between two structures may have a predetermined range of allowance. For example, even when the protrusion 220 of the filter 201 is moved within a predetermined range on the x-y plane due to an assembling tolerance, an electrical connection between the protrusion 220 and the elastic structure 230 may be maintained. In addition, in another example, an electrical connection between the protrusion 220 and the elastic structure 230 may be maintained due to the elastic force of the elastic structure 230 even when the height difference between the protrusion 220 of the filter 201 and the surface of the PCB 203 is smaller than a reference value due to an assembling tolerance or variation in a processing process. When the height difference occurs, the protrusion 220 may be further moved in the (−) z-axis direction. In this case, by using elasticity to pressure applied in the (−) z-axis direction, the elastic structure 230 may maintain a contact structure between the protrusion 220 and the elastic structure 230.

Figure 4B:
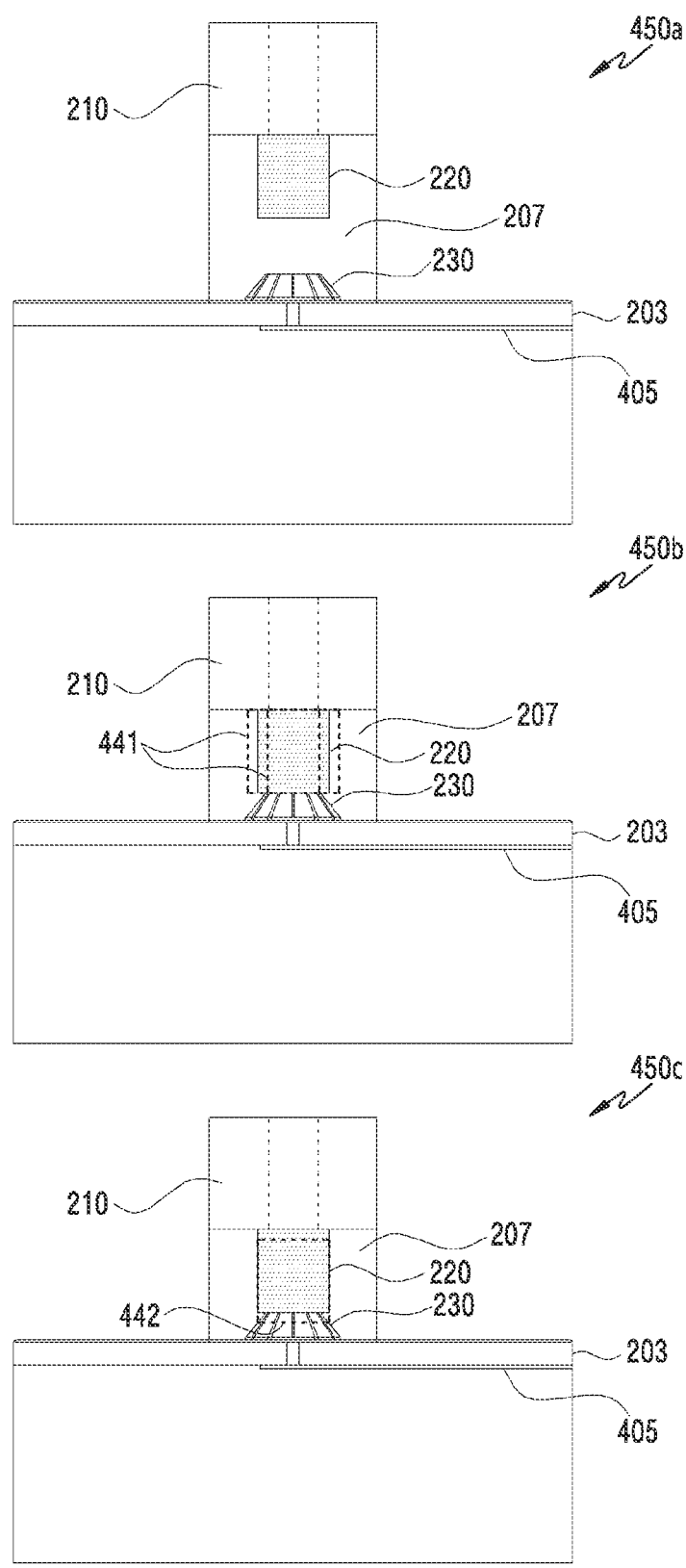
FIG. 4B illustrates an example of a cross-section of the arrangement of a connection structure according to various embodiments.

FIG. 4B illustrates an example of a cross-section of the arrangement of a connection structure according to various embodiments. The connection structure refers to a contact structure of an RF component and an elastic structure. The filter 201 in FIG. 2B is provided as an example of the RF component. The elastic structure 230 in FIG. 2B is provided as an example of the elastic structure. FIG. 4B is a sectional view two-dimensionally illustrating the three-dimensional space illustrated in FIG. 4A. The cross sections in FIG. 4B may be cross sections parallel to the y-z plane in FIG. 4A.

Referring to FIG. 4B, a first sectional view 450a illustrates a cross section of a connection structure before contact between the protrusion 220 and the elastic structure 230. The guide part 210 may fix the protrusion 220 to the filter 201, and may provide a region in which the protrusion 220 comes in contact with the elastic structure 230. One surface of the guide part 210 including an opening section may be mechanically fastened to the PCB 203. However, such a fastening structure is omitted in FIG. 4. The protrusion 220 may come in contact with the elastic structure 230 by moving in the (−) z-axis direction.

A second sectional view 450b and a third sectional view 450c illustrate cross sections after contact between the protrusion 220 and the elastic structure 230. The protrusion 220 has been in physical contact with the elastic structure 230 by the movement of the elastic structure 230 in the (−) z-axis direction. Since both the protrusion 220 and the elastic structure 230 are conductive members and can transmit electrical signals, an electrical connection between the filter 201 and the PCB 203 may be maintained. The elastic structure 230 may be connected to an antenna or an RF component via the feeder line 405 of the PCB 203.

According to various embodiments, the arrangement form in which the protrusion 220 comes in contact with the elastic structure 230 may be flexibly changed within a predetermined range 441 or 442. That is, at the time of assembling the protrusion 220 and the elastic structure 230, the connection structure has a predetermined range of allowance. For example, referring to the second sectional view 450b, even when the filter 201 is moved leftward (in the (−) x-axis direction) or rightward (in (+) x-axis direction) within the predetermined range 441 due to an assembling tolerance, an electrical connection between the protrusion 220 and the elastic structure 230 may be maintained. The predetermined range 441 is determined based on at least one of an area of the contact surface of the protrusion or an area of the opening section on a region parallel to the first surface of the first RF component. Further, for example, referring to the third sectional view 450c, even when the filter 201 is moved further downward (in the (−) z-axis direction) in the predetermined range 442 due to an assembling tolerance, an electrical connection between the protrusion 220 and the elastic structure 230 may be maintained due to the elastic force of the elastic structure 230. The predetermined range 442 is determined based on at least one among a height of the elastic structure, a degree of elasticity of the elastic structure, or a shape of a contact surface of the protrusion. The guide region comprises a space according to the first range and the second range.

Figure 5:
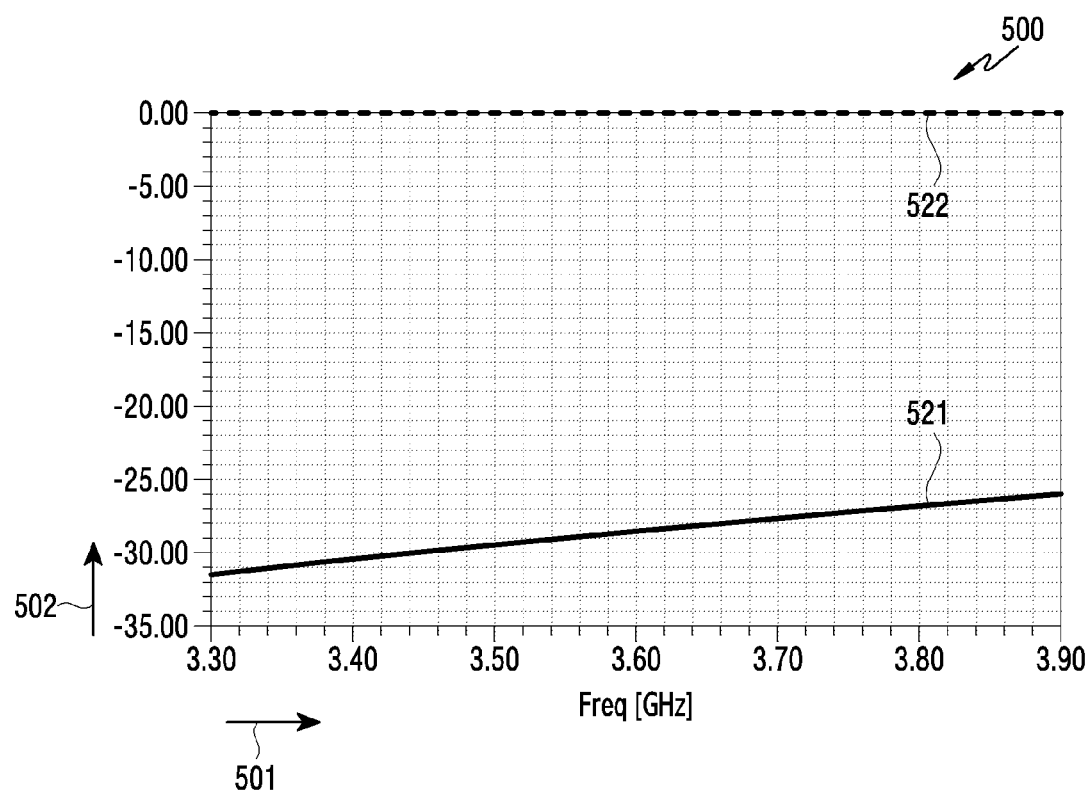
FIG. 5 illustrates an example of performance of an electrical connection between an RF component and an elastic structure according to various embodiments.

FIG. 5 illustrates an example of performance of an electrical connection between an RF component and an elastic structure according to various embodiments. The filter 201 in FIG. 2B is provided as an example of the RF component. The elastic structure 230 in FIG. 2B is provided as an example of the elastic structure.

Referring to FIG. 5, a graph 500 indicates a scattering (S)-parameter according to a frequency change. The horizontal axis 501 indicates a frequency and the vertical axis 502 indicates S-parameter. The S-parameter indicates a ratio of input voltage to output voltage in frequency distribution on a RF circuit. The S-parameter may include S11. It is identified that when S11 has a value equal to or less than a threshold value (e.g. −28 dB), a connection structure of the filter 201 and the elastic structure 230 provides a normal electrical connection. For example, when S11 has a value close to −30 dB, performance of the filter 201 due to low reflection loss may be identified. A solid line 521 indicates S11 for an electrical connection between the filter 201 and the elastic structure 230. Further, the S-parameter may include S21. A dotted line 522 indicates S21 for an electrical connection between the filter 201 and the elastic structure 230. It is identified that when S21 has a value equal to or greater than a reference value (e.g. −1 dB), the connection structure of the filter 201 and the elastic structure 230 provides a normal electrical connection. For example, when S21 has a value close to 0 dB, performance of the filter 201 due to a high transfer coefficient may be identified.

Figure 6A:
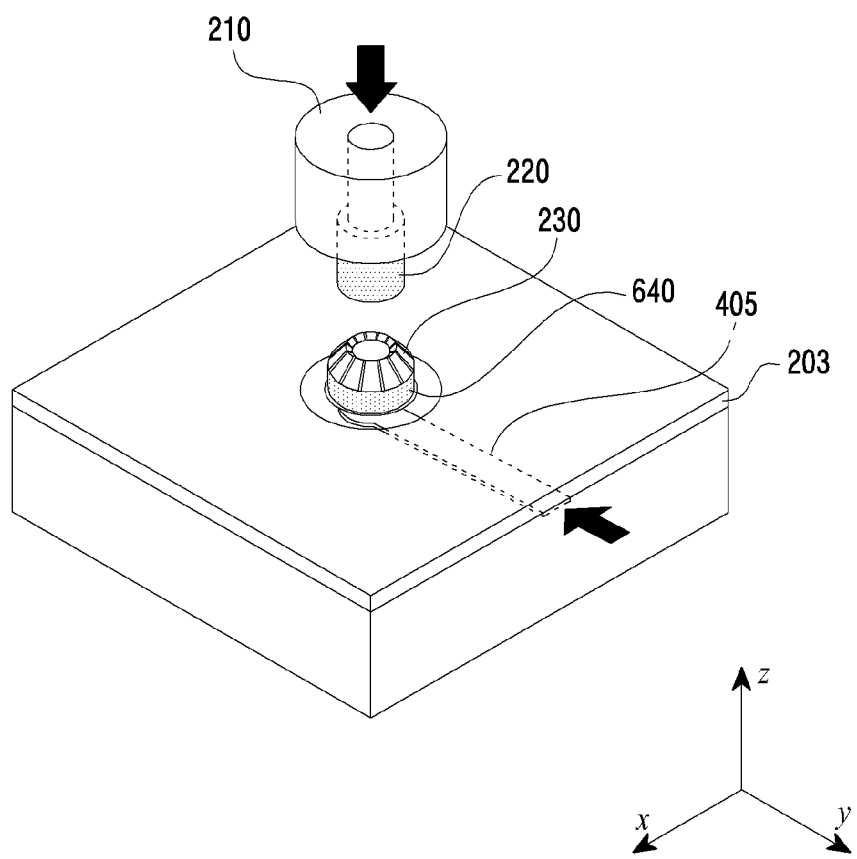
FIG. 6A illustrates an example of a connection structure including a support member according to various embodiments.
Figure 6B:
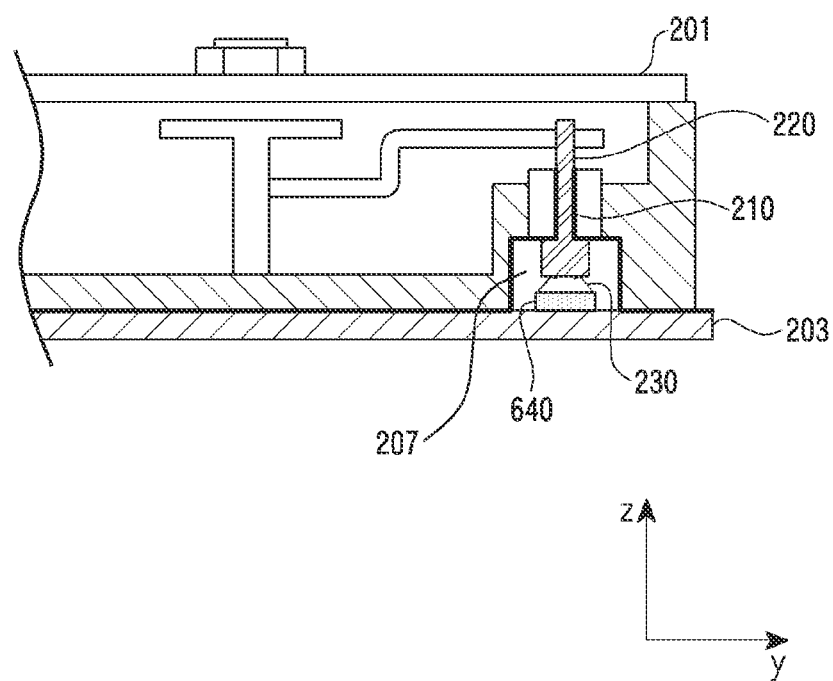
FIG. 6B illustrates an example of a connection structure including a support member according to various embodiments.

FIG. 6A illustrates an example of a connection structure including a support member according to various embodiments, and FIG. 6B illustrates an example of a connection structure including a support member according to various embodiments. The connection structure refers to a contact structure of an RF component and an elastic structure. The filter 201 in FIG. 2B is provided as an example of the RF component. The elastic structure 230 in FIG. 2B is provided as an example of the elastic structure.

Referring to FIG. 6A, the elastic structure 230 may be connected to a support member 640 rather than being directly attached to the PCB 203, and the support member 640 may be connected to the PCB 203. The support member 640 may include a conductive member for an electrical flow of an RF signal. The support member 640 may be called a boss structure.

It will be assumed that the height of the protrusion 220 positioned in the filter 201 is larger than the sum of the height of a surface coupled to the PCB 203 and the height of the elastic structure 230. In this case, it may be difficult for the protrusion 220 to come in contact with the elastic structure 230. Further, when the height of the protrusion 220 positioned in the filter 201 is larger but is not sufficiently larger than the sum of the height of the surface coupled to the PCB 203 and the height of the elastic structure 230, a gap tends to be formed due to a margin at the time of coupling between the filter 201 and the PCB 203. Therefore, it may be difficult for the protrusion 220 to be in stable contact with the elastic structure 230. Unstable contact refers to an unstable electrical connection, and thus may cause electrical-performance degradation due to a circuit disconnection of communication equipment. Therefore, in the connection structure according to various embodiments, the support member 640 may be disposed between the elastic structure 230 and the PCB 203 so as to provide a stable electrical connection between two RF components (e.g. the filter 201 and the PCB 203) due to an assembling tolerance or a processing variation.

Referring to FIG. 6B, a cross section of the connection structure in FIG. 6A is illustrated. FIG. 6B illustrates a cross section parallel to the y-z plane in FIG. 6A. When the difference h1 between the height of the protrusion 220 of the filter 201 and the height of a surface at which the guide part 210 is coupled to the PCB 203 (that is, the height of the contact surface of the protrusion from the first surface of the PCB) is equal to or smaller than the height h2 of the elastic structure 230, an electrical connection may be maintained through the elastic force of the elastic structure 230. However, when the height difference h1 between two structures is greater than the height h2 of the elastic structure 230, it may be difficult to form an electrical connection through contact between the protrusion 220 and the elastic structure 230. When the height difference h1 between two structures is not sufficiently small even though being equal to or smaller than the height h2 of the elastic structure 230, physical contact may be released due to a gap during vibration. In order to solve the problem that a stable electrical connection may not be provided due to the height difference, the connection structure according to various embodiments may further include the support member 640.

In some embodiments, the sum of the height h3 of the support member 640 and the height h2 of the elastic structure 230 may be greater than the difference h1 between the height of the protrusion 220 of the filter 201 and the height of the surface at which the guide part 210 is coupled to the PCB 203. In order to minimize a phenomenon due to an assembling error and the gap, the support member 640 may be disposed so as to maintain an electrical connection. The support member 640 may have the height h3 such that the sum of the height h3 of the support member 640 and the height h2 of the elastic structure 230 is greater, by a threshold value or more, than the difference h1 between the height of the protrusion 220 and the height of the surface at which the guide part 210 is coupled to the PCB 203. The threshold value may be predefined based on the elastic force of the elastic structure 230.

Figure 7A:
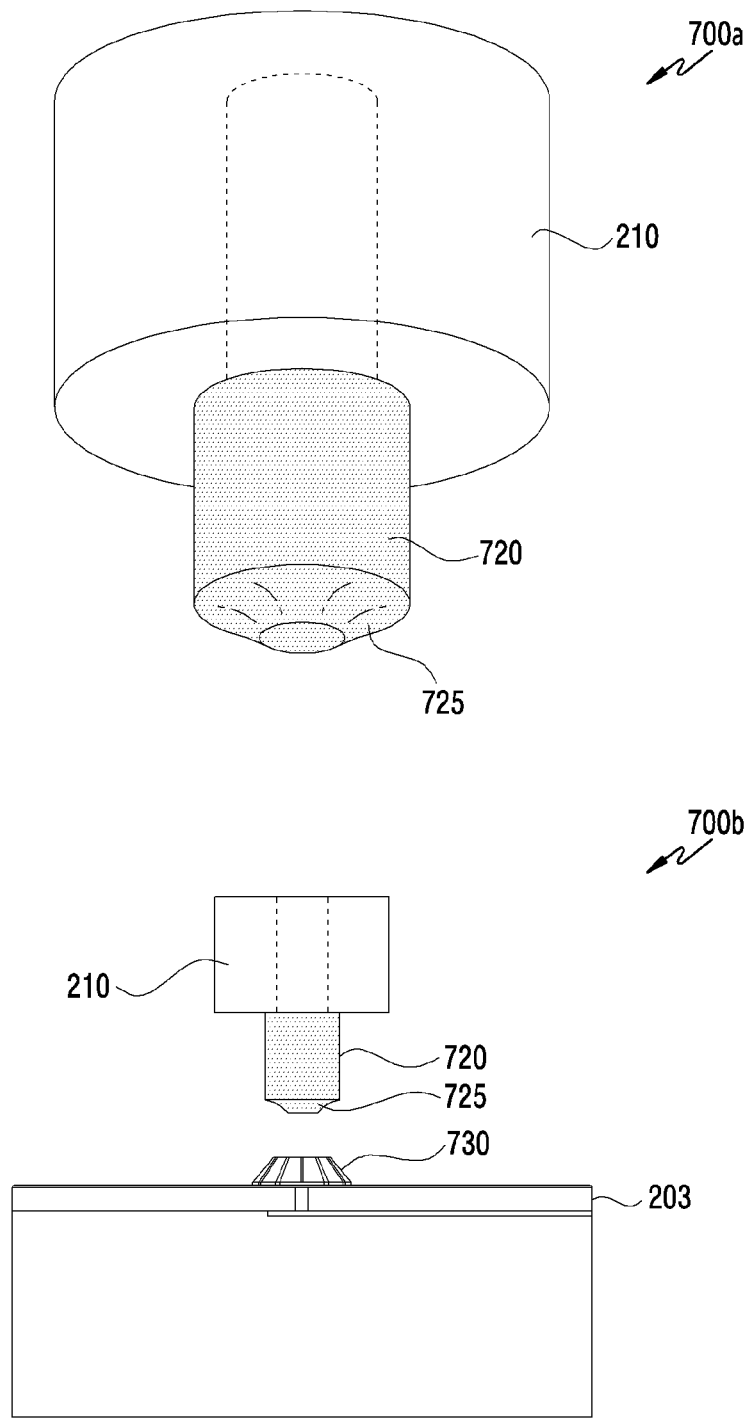
FIG. 7A illustrates an example of a connection structure based on the elasticity of an elastic structure according to various embodiments.
Figure 7B:
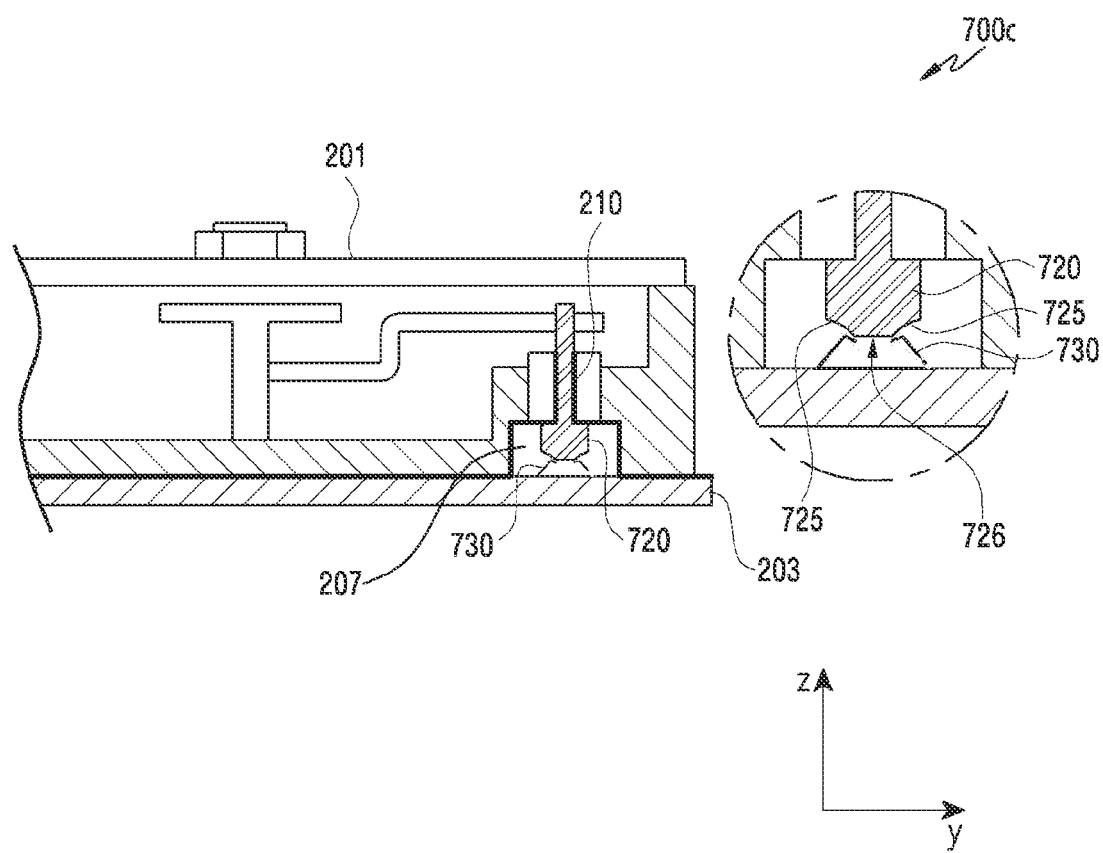
FIG. 7B illustrates an example of a connection structure based on the elasticity of an elastic structure according to various embodiments.

FIG. 7A illustrates an example of a connection structure based on the elasticity of an elastic structure according to various embodiments; and FIG. 7B illustrates an example of a connection structure based on the elasticity of an elastic structure according to various embodiments. The connection structure refers to a contact structure of an RF component and an elastic structure. The RF component may be a filter (e.g. the filter 201 in FIG. 2A).

Elasticity refers to the property of an object deformed by an external force to return to its original shape. In this case, the ability to return to the original shape is called an elastic force. For example, due to pressure applied to the elastic structure 230 by the movement of the protrusion 220 in the (−) z-axis direction, the elastic structure 230 may have a deformed shape. At this time, an elastic force to resist the pressure may act in the elastic structure 230. A direction in which the elastic force acts may be opposite to a direction in which the pressure is applied.

The higher the elasticity of the elastic structure 230 is, the more sufficient pressure the elastic structure 230 may endure. Even when the protrusion 220 is moved (e.g. is moved in the (+) z-axis direction) due to the vibration of the filter 201, the elastic structure 230 may maintain physical contact with the protrusion 220 due to an elastic force acting in a direction opposite to a direction in which the existing pressure is applied. On the other hand, when the elastic force of the elastic structure 230 becomes lower, it may be difficult for the elastic structure 230 to endure a sufficient pressure. As the elastic force of the elastic structure 230 becomes lower, it may be difficult or take much time for the elastic structure 230 to return to its original shape when the protrusion 220 is moved (e.g. is moved in the (+) z-axis direction) due to the vibration of the filter 201. Therefore, the elastic structure 230 having a low elastic force may be used to increase a fastening strength of a contact structure through structural deformation rather than to come into contact with the protrusion 220 by simply forming an instantaneous contact with the protrusion 220. According to various embodiments, the level of elasticity may be defined depending on whether the elasticity modulus of the elastic structure 230 is higher than a predefined reference value (e.g. unit: N/m2).

Hereinafter, with reference to FIGS. 7A and 7B, a description will be made of an example of a connection structure of a protrusion 720 and an elastic structure 730 for increasing the fastening strength of the contact structure. The elasticity modulus of the elastic structure 730 in FIGS. 7A and 7B may be lower than a predetermined reference value (e.g. unit: N/m2).

Referring to FIG. 7A, a perspective view 700a illustrates an input/output part of the filter 201. The filter 201 may include the guide part 210 and the protrusion 720. The protrusion 720 may include a stepped concave structure. The stepped concave structure refers to a structure in which the protrusion 720 is concavely formed by forming high and low steps when the protrusion 720 in FIG. 7A is seen from the side. For example, the protrusion 720 may have a cylindrical shape having a volume in a direction perpendicular to a surface of the PCB 203, and the protrusion 720 may have, as a contact surface 725, a region concavely formed between the bottom surface and the side surface of the cylindrical shape. Since the contact surface 725 of the protrusion 720 coming in contact with the elastic structure 730 has a concave shape rather than a flat shape, the protrusion 720 may come in easier contact with the elastic structure 730 and the contact may not be physically easily released regardless of the deformed shape of the elastic structure 730.

Referring to a sectional view 700b, in the cylindrical shape, a region adjacent to the side surface is formed to be steppedly concave, and thus the protrusion 720 may form a contact with the elastic structure 730 at the contact surface 725 of the protrusion 720. Even when the elasticity of the elastic structure 730 is lower than a reference value (e.g. the elasticity modulus of the elastic structure 230 in FIG. 3) and thus the position of the protrusion 720 is changed by the movement of the filter 201, the contact surface 725 of the protrusion 720 may maintain contact with the elastic structure 730 due to a physical limit in a contact part of the elastic structure 730. As the contact between the protrusion 720 and the elastic structure 730 is maintained, a stable electrical connection may be formed on the contact surface 725.

Referring to an inside sectional view 700c in FIG. 7B, when the protrusion 720 positioned in the filter 201 is seen from below (the (−) z-axis direction), the protrusion 720 may have a structure in which a bottom surface 726 thereof is not flat and a partial surface adjacent to the side surface is concavely formed. The concave partial surface may be the contact surface 725. The contact surface 725 may form physical contact with the elastic structure 730. The contact surface 725 may form physical contact with the contact part or the inner surface of the elastic structure 730. As an area contactable in various direction increases, contact between the protrusion 720 and the elastic structure 730 is less likely to be released by a physical change due to a vibration, an assembling tolerance, a design change, a temperature influence, etc. That is, a connection between two structures may become more robust through the protrusion 720 formed in the stepped concave structure.

FIGS. 7A and 7B illustrate, as an example, a robust connection structure for supplementing a low elastic force. However, needless to say, the connection structure in FIGS. 7A and 7B may be applied for a more stable connection even though there is a sufficient elastic force. The connection structure in FIGS. 7A and 7B may be applied in order to solve problems, such as a temperature influence due to the geographical position of communication equipment and an accumulated tolerance increase due to the mobility or use change of communication equipment.

Figure 8A:
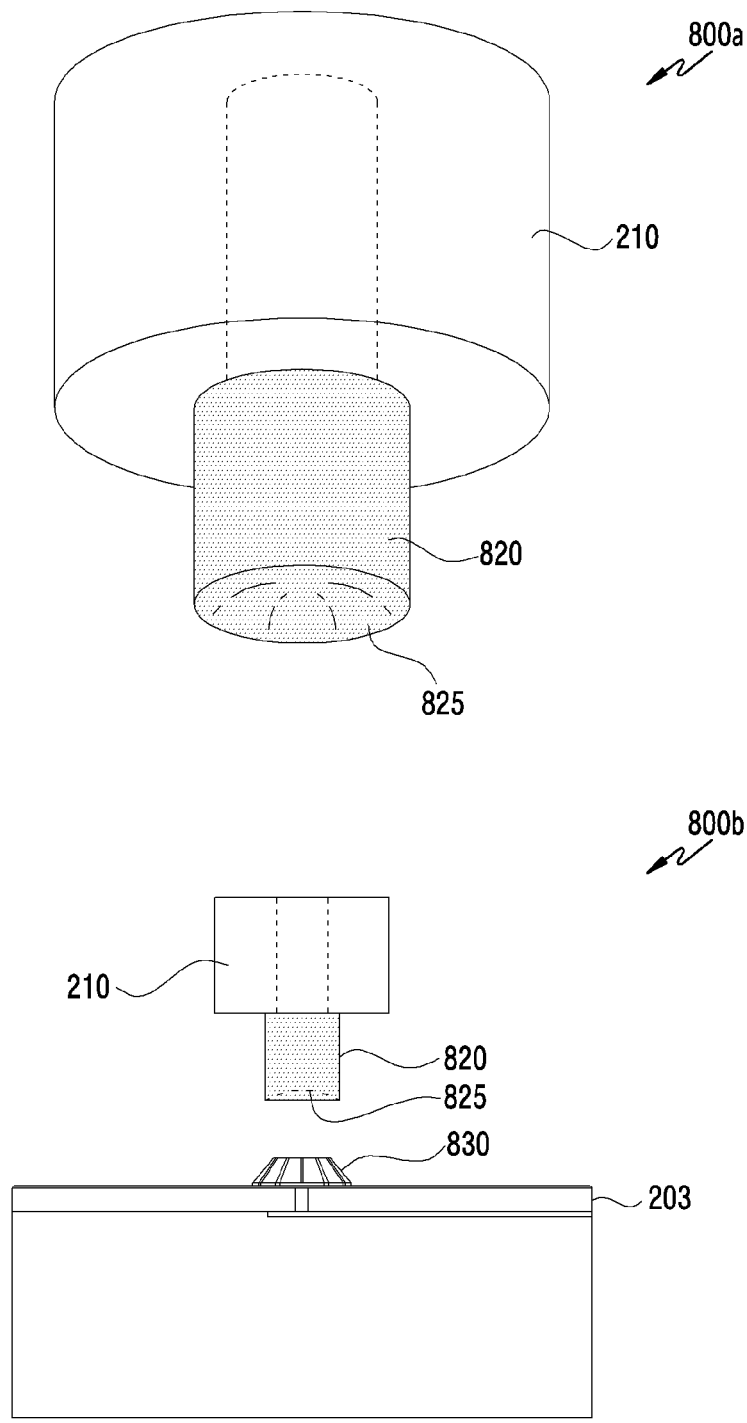
FIG. 8A illustrates an example of a connection structure for securing a stable ground according to various embodiments.
Figure 8B:
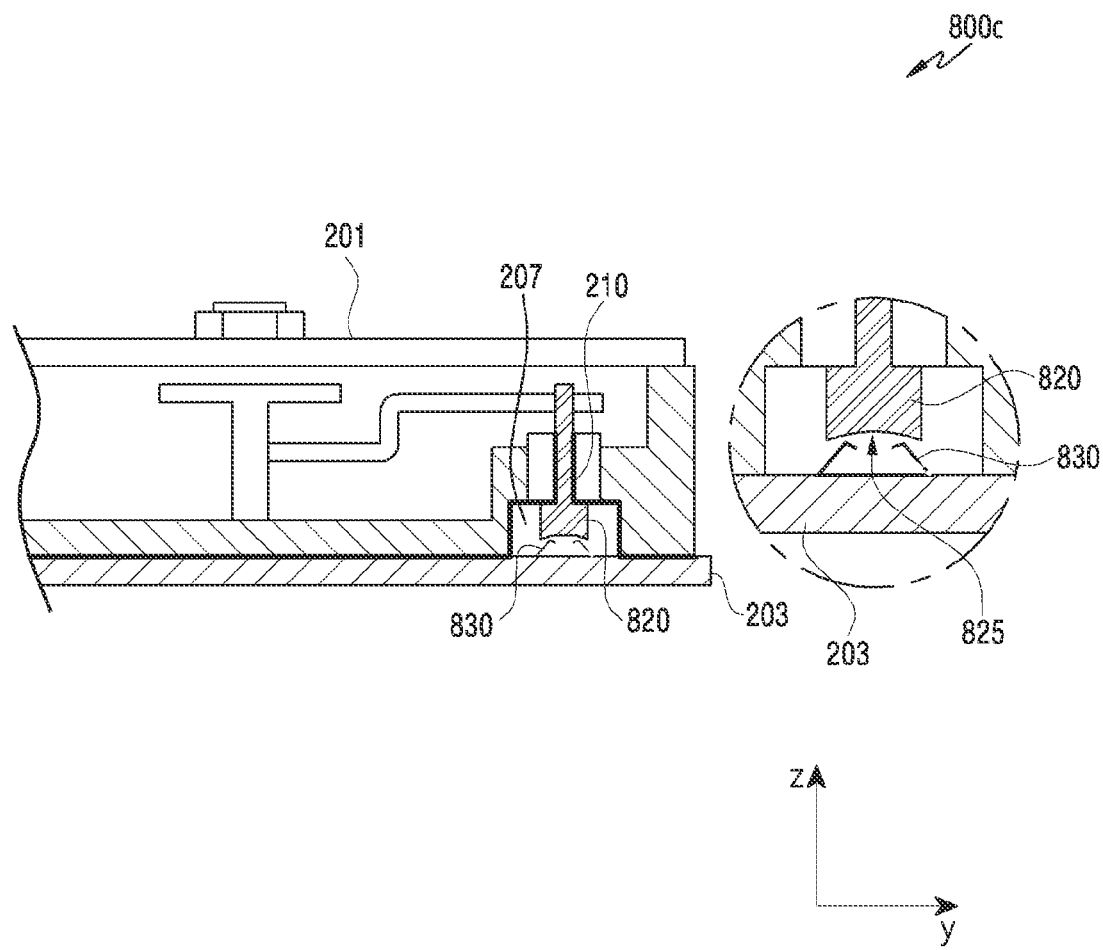
FIG. 8B illustrates an example of a connection structure for securing a stable ground according to various embodiments.

FIG. 8A illustrates an example of a connection structure for securing a stable ground according to various embodiments, and FIG. 8B illustrates an example of a connection structure for securing a stable ground according to various embodiments. The connection structure refers to a contact structure of an RF component and an elastic structure. The RF component may be a filter (e.g. the filter 201 in FIG. 2A).

A protrusion 820 of a connection structure according to various embodiments may include a ground part therein. A ground is a function of maintaining a reference potential to remove leakage current and unnecessary electrical energy, thereby maintaining a stable circuit. Electromagnetic interference (EMI) performance may be improved by securing a ground path. When the ground part is connected to the PCB 203 by coming in contact with the elastic structure 230, ground paths may be formed on the connection structure.

If the elasticity of an elastic structure 830 is equal to or greater than a reference value, this means that the property of the elastic structure 830 to maintain its original shape against pressure applied from the outside is relatively strong. When pressure is applied inward (toward the center) such that the elastic structure 830 has a bent structure, the elastic structure 830 may have an elastic force outward (outward from the center). If elasticity is sufficient, when pressure is decreased by a physical change due to a vibration, an assembling tolerance, a design change, a temperature influence, etc., the elastic structure 830 may have an elastic force outward in order to return to its original shape. There may be a need for the structure of the protrusion 820, which can provide a drag force in a direction opposite to the direction of the elastic force such that physical contact between the protrusion 820 and the elastic structure 830 is not released due to the elastic force.

Hereinafter, a connection structure between the protrusion 820 and the elastic structure 830, having a high fastening strength based on an elastic force of a contact structure, will be described with reference to FIGS. 8A and 8B. The elasticity modulus of the elastic structure 830 in FIGS. 8A and 8B may have a value higher than a predefined reference value (e.g. unit: N/m2).

Referring to FIG. 8A, a perspective view 800a illustrates an input/output part of the filter 201. The filter 201 may include the guide part 210 and the protrusion 820. The protrusion 820 may include a contact surface 825 concavely formed toward the inside of the protrusion 820. The contact surface 825 may be a curved surface. In other words, the protrusion 820 may include a structure in which the contact surface 825 is concavely formed, i.e., a concave structure. For example, the protrusion 820 may have a cylindrical shape having a volume in a direction perpendicular to a surface of the PCB 203, and the protrusion 820 may have the bottom surface of the cylindrical shape, which is not flat but is concavely formed, as the contact surface 825.

Referring to a sectional view 800b, the protrusion 820 may come in contact with the elastic structure 830 through the contact surface 825. Since the bottom surface is concavely formed inward in the cylindrical shape, the protrusion 820 may form a contact with the elastic structure 830 at the contact surface 825. When the position of the protrusion 820 is changed by the movement of the filter 201 and thus pressure applied to the elastic structure 830 is decreased, the restoring force of the elastic structure 830 to maintain its original shape may sufficiently act because the degree of elasticity of the elastic structure 830 is higher than the reference value (e.g. is higher than the elasticity modulus of the elastic structure 230 in FIG. 3). In this case, a drag force acts in a direction opposite to the direction of the restoring force due to the physical limit of the contact surface 825 of the protrusion 820. Thus, the protrusion 820 and the elastic structure 830 may more easily maintain contact therebetween. As the contact between the protrusion 820 and the elastic structure 830 is maintained, a ground connection may be stably maintained on the contact surface 825. Since the contact surface 825 of the protrusion 820 is formed as a curved surface, the protrusion 820 may maintain stable contact of inner signal lines of the protrusion 820 and the elastic structure 830 even though the elastic structure 830 has strong elasticity.

Referring to an inside sectional view 800c in FIG. 8B, when the protrusion 820 positioned in the filter 201 is seen from below (the (−) z-axis direction), the protrusion 820 has a shape in which the bottom surface thereof is not flat but is concavely formed toward the center of the protrusion 820. The protrusion 820 may form physical contact with the elastic structure 830 through the contact surface 825. The contact surface 825 may form physical contact with the contact part or the inner surface of the elastic structure 830. The contact surface 825 is arranged in a direction in which the elastic force of the elastic structure 830 acts. Thus, even when pressure applied to the elastic structure 830 is changed by a physical change due to a vibration, an assembling tolerance, a design change, a temperature influence, etc., contact between the protrusion 820 and the elastic structure 830 is less likely to be released. That is, an electrical connection between two structures may become more robust through the protrusion 820 formed in a concave structure.

FIGS. 8A and 8B illustrate an example of a connection structure between structures for a stable electrical connection according to a high elastic force. A stronger grip force may be used regardless an elastic force. For the stronger grip force, a method for adjusting the contact height between the protrusion and the elastic structure or changing the shape of the contact surface may be considered. The adjustment of the contact height may be associated with the degree of elasticity of the elastic structure. The higher the elasticity is, the more easily the shape is maintained. Thus, even though the size of a contact region between the elastic structure of the PCB and the protrusions small, an electrical connection may be stably maintained. Further, in order to improve a grip force regardless the degree of elasticity, a method using the shape of the contact surface may be considered. Hereinafter, a method for increasing a grip force using the shape of the contact surface will be made with reference to FIGS. 9A and 9B.

Figure 9A:
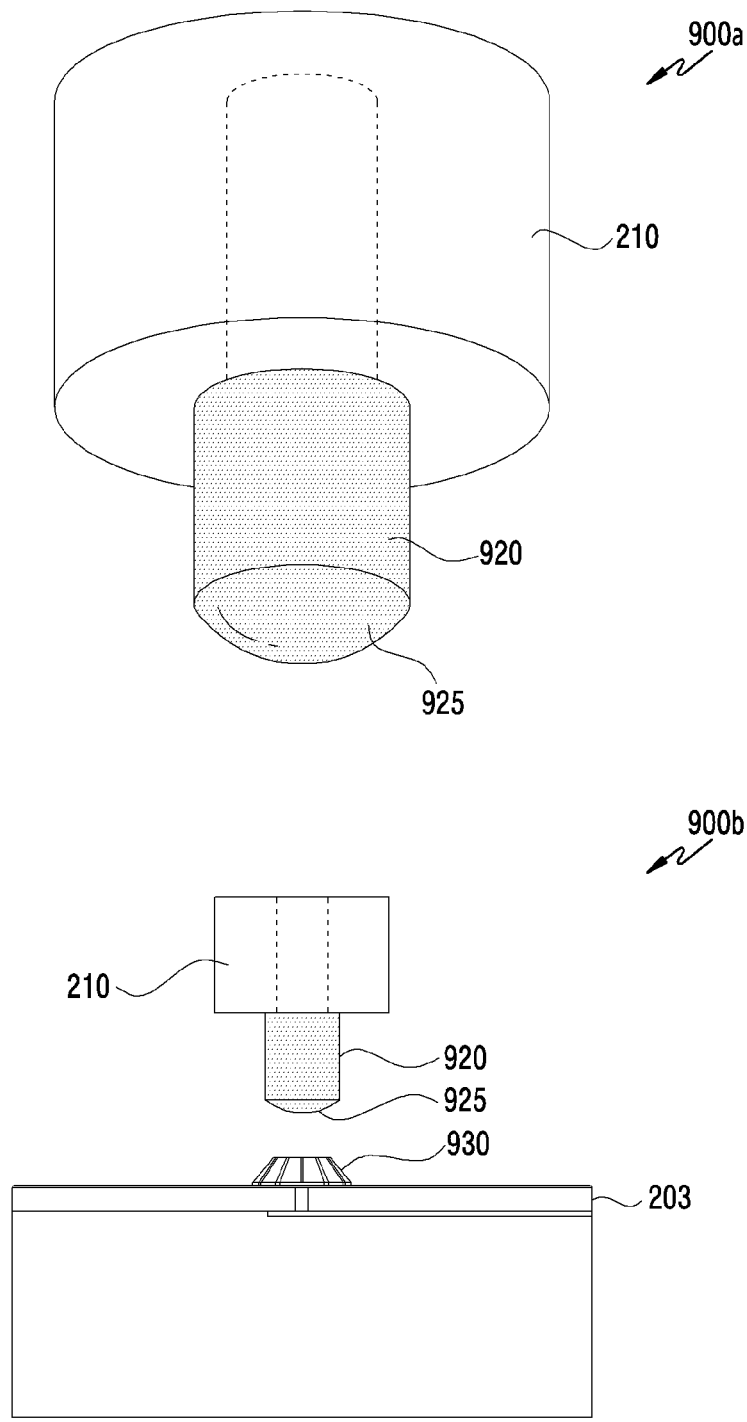
FIG. 9A illustrates an example of a connection structure for a strong grip force according to various embodiments.
Figure 9B:
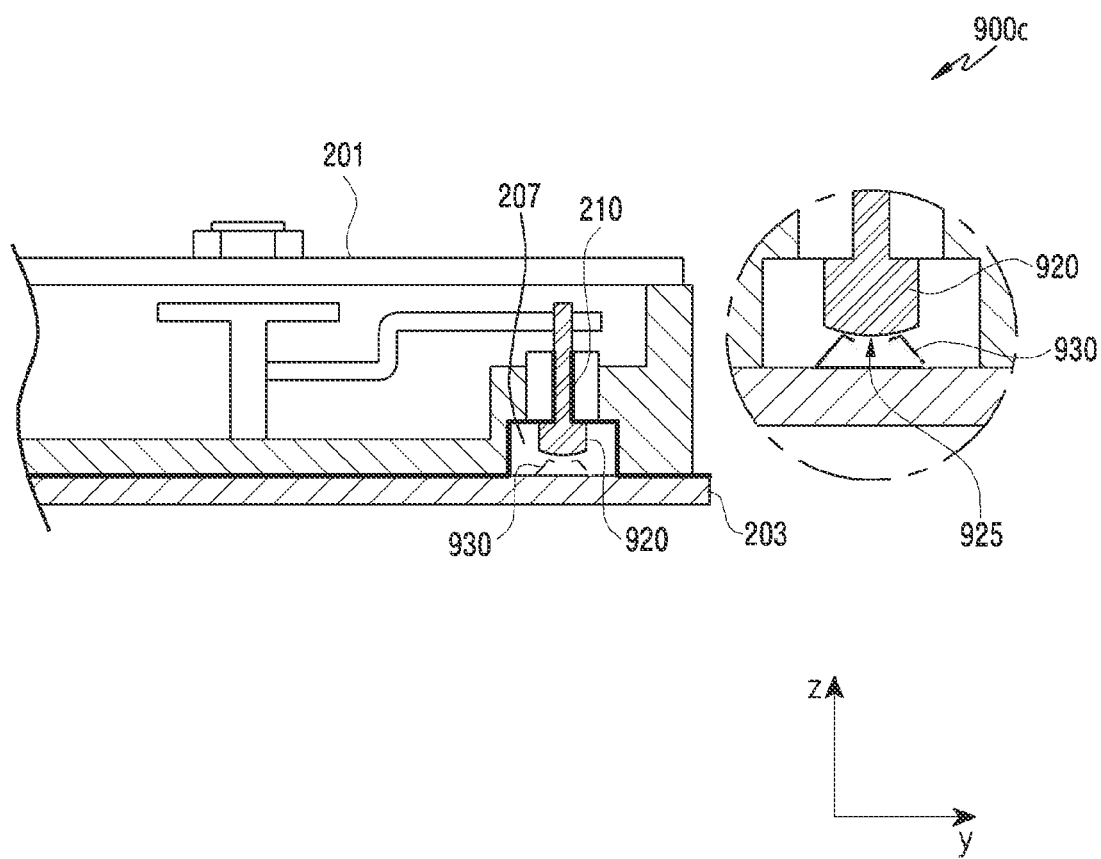
FIG. 9B illustrates an example of a connection structure for a strong grip force according to various embodiments.

FIG. 9A illustrates an example of a connection structure for a strong grip force according to various embodiments, and FIG. 9B illustrates an example of a connection structure for a strong grip force according to various embodiments. The connection structure refers to a contact structure of an RF component and an elastic structure. The RF component may be a filter (e.g., the filter 201 in FIG. 2A).

A perspective view 900a illustrates an example of an input/output part of the filter 201. The filter 201 may include the guide part 210 and a protrusion 920. The protrusion 920 may include a contact surface 925 convexly formed outward from the protrusion 820. The contact surface 925 may be a curved surface. In other words, the protrusion 920 may include a structure in which the contact surface 925 convexly protrudes, i.e., a convex structure. For example, the protrusion 920 may have a cylindrical shape having a volume in a direction perpendicular to a surface of the PCB 203, and the protrusion 920 may have the bottom surface of the cylindrical shape, which is not flat but convexly protrudes, as the contact surface 925.

Referring to a sectional view 900b, the protrusion 920 may come in contact with an elastic structure 930 through the contact surface 925. Since the bottom surface convexly protrudes in the cylindrical shape, the protrusion 920 may form a contact with the elastic structure 930 at the contact surface 925. A grip force may be the force by which two structures are attached to each other. Communication equipment may be moved by an influence of a frictional force, an influence of temperature, an influence of a gap phenomenon, etc., and the position of the protrusion 920 and the position of the elastic structure 930 may be relatively changed by the movement. In order for the protrusion 920 to come in stable contact with the elastic structure 930 despite the movement, it is desirable to secure a region, in which a contact can be formed, in a variety of directions on a space.

Referring to an inside sectional view 900c in FIG. 9B, the contact surface 925 of the protrusion 920 positioned in the filter 201 has a convexly protruding shape.

In the shape of the protrusion 920, the protrusion 920 may form physical contact with the inner surface of the elastic structure 930, or a portion of the protrusion 920 (a region protruding in the (−) z-axis direction among regions of the contact surface 925) may be positioned in the elastic structure 930. Since the portion of the protrusion 920 is positioned in the elastic structure 930, an electrical connection may be maintained due to a physical limit of the elastic structure 930 even though the protrusion 920 moves.

A vibration, an assembling tolerance, a design change, a temperature influence, etc. may change the physical positions of the protrusion 920 and the elastic structure 930. As a contactable area is secured to be larger in various movement directions, contact between the protrusion 920 and the elastic structure 930 may be less likely to be released. For example, curved surfaces formed in the left and right directions of the center (parallel to the y-axis direction) of the protrusion 920 have different directionalities. Therefore, when the movement of the filter 201 has been made in the (+) x-axis direction, the protrusion 920 may secure a region in which the protrusion 920 can come in contact with the elastic structure 930. Further, when the movement of the filter 201 has been made in the (−) x-axis direction, the protrusion 920 may also secure a region in which the protrusion 920 can come in contact with the elastic structure 930. Accordingly, a connection between two structures may become more robust through the protrusion 920 having a convex structure.

For an electrical connection between a filter and a PCB, a contact structure between a protrusion of the filter and an elastic structure attached to the PCB has been described with reference to FIGS. 2A to 9B. The connection structure using one RF input/output port of the filter has been provided as an example. However, a structure, in which the filter includes multiple RF input/output ports and each input/output port makes an electrical connection through the above-described contact structure, may be understood to be an embodiment. Further, when one filter is provided with N ports, some of the N ports may include at least one of the connection structures illustrated in FIGS. 2B to 9B, and others of the N ports may include at least one among a blind mating connector, a pin-socket type connector, or a fastening structure using a spring and an insulation bush.

The disclosure has described a connection structure between a filter and an RF component as an example, but an electronic device of the disclosure corresponds to communication equipment in which multiple antenna elements are integrated. Thus, an electronic device in which multiple filters are connected may also be understood to be one embodiment. The multiple filters may include at least one of the connection structures illustrated in FIGS. 2B to 9B. The filters may have the same connection structure or may have different connection structures. For example, a first group of the multiple filters included in the electronic device may have the protrusion according to FIGS. 7A and 7B, and a second group thereof may have the protrusion according to FIGS. 8A and 8B. Further, for example, a first group of connection structures between a PCB and the multiple filters in the electronic device may be configured to include the protrusion and the elastic structure according to the FIGS. 2B, 4A, and 4B, and a second group thereof may be configured to include the protrusion, the elastic structure, and the support member according to FIG. 6. In other words, a connection structure between a protrusion of a filter and an elastic structure of a PCB may be implemented in an electronic device through a combination of identical or similar connection structures.

In various embodiments, a sufficient tolerance may be secured by considering variety in the arrangement between a protrusion of a filter and an elastic structure of a PCB in a three-dimensional space. Further, various embodiments may provide miniaturization and an advantage in a cost perspective through a simplified contact structure, and may secure a sufficient electrical connection even in the case of a physical change such as a processing variation, an accumulate tolerance, an influence due to temperature, or an abrasion over time, thereby providing communication equipment, including a large number of RF components, with the optimum fastening structure between the RF components.

According to various embodiments, a connection assembly for radio frequency (RF) components, the connection assembly comprising: a first RF component comprising an opening section and a protrusion formed in the opening section; an elastic structure; a printed circuit board (PCB); and a second RF component connected to the PCB, wherein: the elastic structure is disposed on a first surface of the PCB, a first surface of the first RF component comprises the opening section and is coupled to the first surface of the PCB, and the protrusion of the first RF component is configured to come in contact with the elastic structure, thereby forming an electrical connection between the first RF component and the second RF component.

In some embodiments, the opening section forms a guide region; and the elastic structure is flexibly arranged in the guide region.

In some embodiments, the elastic structure is flexibly arranged in a first range in a direction perpendicular to the first surface of the PCB; the elastic structure is flexibly arranged in a second range in a region parallel to the first surface of the PCB; and the guide region comprises a space according to the first range and the second range.

In some embodiments, the first range is determined based on at least one among a height of the elastic structure, a degree of elasticity of the elastic structure, or a shape of a contact surface of the protrusion; and the second range is determined based on at least one of an area of the contact surface of the protrusion or an area of the opening section on a region parallel to the first surface of the first RF component.

In some embodiments, the elastic structure is attached to the first surface of the PCB and forms an electrical connection to the second RF component.

In some embodiments, a height of the elastic structure is greater, by a reference value or more, than a height of a contact surface of the protrusion from the first surface of the PCB; and the reference value is related to elasticity of the elastic structure.

In some embodiments, the elastic structure is attached to a conductive support member; and the conductive support member is attached to the first surface of the PCB.

In some embodiments, a sum of a height of the conductive support member and the height of the elastic structure is greater, by a reference vale or more, than the height of a contact surface of the protrusion from the first surface of the PCB; and the reference value is related to elasticity of the elastic structure.

In some embodiments, the elastic structure is a structure which is capable of being deformed from a basic shape into a contracted shape based on pressure of the protrusion.

In some embodiments, the elastic structure comprises: a bottom surface; an outer surface forming an exterior of the elastic structure; a ring-shaped contact part configured to form at least one contact due to contact with the protrusion; and an inner surface disposed in a ring-shaped inner region.

In some embodiments, the protrusion has a cylindrical shape having a volume in a direction perpendicular to the first surface of the PCB; the protrusion has a structure in which portions adjacent to a bottom surface and a side surface of the cylindrical shape are concavely formed; the portions of the protrusion come in contact with the contact part of the elastic structure; and the bottom surface of the protrusion is arranged in the inner region.

In some embodiments, the protrusion has a cylindrical shape having a volume in a direction perpendicular to the first surface of the PCB; the protrusion has a structure in which a bottom surface of the cylindrical shape is concavely formed; and the bottom surface of the protrusion is configured to come in contact with the contact part.

In some embodiments, the protrusion has a cylindrical shape having a volume in a direction perpendicular to the first surface of the PCB; the protrusion has a structure in which a bottom surface of the cylindrical shape convexly protrudes;

In some embodiments, the bottom surface of the protrusion is configured to come in contact with the contact part of the elastic structure; and a partial region of the protrusion is arranged in the inner region.

In some embodiments, the protrusion comprises at least one ground line; and ground paths related to the at least one ground line are formed in the inner region of the elastic structure.

In some embodiments, the first RF component is a cavity filter for filtering an RF signal of a specific frequency; and the second RF component is an antenna element.

In some embodiments, the PCB further comprises a calibration network and a feeding network.

According to various embodiments, an electronic device in a wireless communication system, the electronic device comprising: a first PCB comprising multiple antenna elements; multiple filters; a second PCB comprising multiple RF components; and at least one processor, wherein: each of the multiple filters comprises a first RF input/output part for connecting the filter to an elastic structure of the first PCB, the first RF input/output part comprises a first guide part and a first protrusion, the first guide part comprises a first fastening surface connected to the first PCB and a first opening section connected to the first protrusion, and the first protrusion is disposed so as to come in contact with the elastic structure of the first PCB in the first opening section.

In some embodiments, each of the multiple filters further comprises a second RF input/output part for connecting the filter to an elastic structure of the second PCB; the second RF input/output part comprises a second guide part and a second protrusion; the second guide part comprises a second fastening surface connected to the second PCB and a second opening section connected to the second protrusion; and the second protrusion is disposed so as to come in contact with the elastic structure of the second PCB in the second opening section.

In some embodiments, the first opening section forms a guide region; and the elastic structure is flexibly arranged in the guide region.

In some embodiments, each of the elastic structure attached to the first PCB and an elastic structure attached to the second PCB comprises: a bottom surface; an outer surface forming an exterior of the elastic structure; a ring-shaped contact part configured to form at least one contact due to contact with the first protrusion; and an inner surface disposed in a ring-shaped inner region.

Methods disclosed in the claims and/or methods according to various embodiments described in the specification of the disclosure may be implemented by hardware, software, or a combination of hardware and software.

When the methods are implemented by software, a computer-readable storage medium for storing one or more programs (software modules) may be provided. The one or more programs stored in the computer-readable storage medium may be configured for execution by one or more processors within the electronic device. The at least one program may include instructions that cause the electronic device to perform the methods according to various embodiments of the disclosure as defined by the appended claims and/or disclosed herein.

The programs (software modules or software) may be stored in non-volatile memories including a random access memory and a flash memory, a read only memory (ROM), an electrically erasable programmable read only memory (EEPROM), a magnetic disc storage device, a compact disc-ROM (CD-ROM), digital versatile discs (DVDs), or other type optical storage devices, or a magnetic cassette. Alternatively, any combination of some or all of them may form a memory in which the program is stored. Further, a plurality of such memories may be included in the electronic device.

In addition, the programs may be stored in an attachable storage device which may access the electronic device through communication networks such as the Internet, Intranet, Local Area Network (LAN), Wide LAN (WLAN), and Storage Area Network (SAN) or a combination thereof. Such a storage device may access the electronic device via an external port. Further, a separate storage device on the communication network may access a portable electronic device.

In the above-described detailed embodiments of the disclosure, an element included in the disclosure is expressed in the singular or the plural according to presented detailed embodiments. However, the singular form or plural form is selected appropriately to the presented situation for the convenience of description, and the disclosure is not limited by elements expressed in the singular or the plural. Therefore, either an element expressed in the plural may also include a single element or an element expressed in the singular may also include multiple elements.

Although specific embodiments have been described in the detailed description of the disclosure, modifications and changes may be made thereto without departing from the scope of the disclosure. Therefore, the scope of the disclosure should not be defined as being limited to the embodiments, but should be defined by the appended claims and equivalents thereof.

Although the present disclosure has been described with various embodiments, various changes and modifications may be suggested to one skilled in the art. It is intended that the present disclosure encompass such changes and modifications as fall within the scope of the appended claims.

What is claimed is:

1. A connection assembly for radio frequency (RF) components, the connection assembly comprising:
    a filter comprising an opening section and a protrusion formed in the opening section;
    a printed circuit board (PCB) including a feeding line;
    an elastic structure attached to a first surface of the PCB and extended along with a direction perpendicular to the first surface of the PCB; and
    an RF component connected to the PCB,
    wherein a first portion of the elastic structure is disposed on the first surface of the PCB and is connected to the feeding line to the RF component,
    wherein a second portion of the elastic structure is configured to detachably engage a concave structure of the protrusion, to form an electrical connection between the filter and the RF component,
    wherein a first surface of the filter comprises the opening section and is coupled to the first surface of the PCB,
    wherein the opening section forms a guide region wider than a region of the elastic structure, in respect to a plane for the first surface of the PCB,
    wherein the concave structure of the protrusion is disposed within the guide region, and
    wherein the guide region comprises a space to guide flexible arrangement between the protrusion and the elastic structure according to a first range in the direction perpendicular to the first surface of the PCB and a second range in a region parallel to the first surface of the PCB,
    wherein the concave structure comprises a contact surface concavely formed toward inside of the protrusion, and
    wherein the contact surface is contacted with the second portion of the elastic structure.

2. The connection assembly of claim 1, wherein the elastic structure is capable of being flexibly arranged in the first surface of the PCB corresponding to the guide region.

3. The connection assembly of claim 1, wherein the first range is determined based on at least one among a height of the elastic structure, a degree of elasticity of the elastic structure, or a shape of the concave structure of the protrusion; and
    wherein the second range is determined based on at least one of an area of the at least one surface of the protrusion or an area of the opening section on the region parallel to the first surface of the filter.

4. The connection assembly of claim 1, wherein the elastic structure is a structure which is capable of being deformed from a basic shape into a contracted shape based on pressure of the protrusion, and
    wherein the pressure is associated with a difference between a height of the elastic structure from the first surface of the PCB and a height of the concave structure of the protrusion from the first surface of the filter.

5. The connection assembly of claim 1, wherein the second portion of the elastic structure comprises an outer surface, a contact part, and an inner surface,
    wherein the contact part comprises a ring-shaped contact part, to contact with the concave structure of the protrusion, and
    wherein the inner surface is disposed in a ring-shaped inner region.

6. The connection assembly of claim 5, wherein the outer surface forms an acute angle from the first surface of the PCB,
    wherein, in case that a first pressure is provided to the elastic structure, the formed acute angle corresponds to a first value, and
    wherein, in case that a second pressure which is greater than the first pressure is provided to the elastic structure, the formed acute angle corresponds to a second value which is smaller than the first value.

7. The connection assembly of claim 5, wherein the outer surface further comprises a plurality of wrinkle parts for reducing a pressure.

* * * * *